(12) United States Patent
Miyatake

(10) Patent No.: US 6,285,439 B1
(45) Date of Patent: Sep. 4, 2001

(54) POSITION DETECTION TECHNIQUE APPLIED TO PROXIMITY EXPOSURE

(75) Inventor: Tsutomu Miyatake, Kiyose (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 09/480,777

(22) Filed: Jan. 10, 2000

Related U.S. Application Data

(62) Division of application No. 09/031,184, filed on Feb. 26, 1998, now Pat. No. 6,049,373.

(30) Foreign Application Priority Data

| Feb. 28, 1997 | (JP) | 9-46525 |
| Feb. 28, 1997 | (JP) | 9-46526 |
| Feb. 28, 1997 | (JP) | 9-46527 |
| Sep. 18, 1997 | (JP) | 9-253786 |

(51) Int. Cl.[7] .......................... G03B 27/42; G03B 27/54; G03B 27/32; G01B 11/00
(52) U.S. Cl. ........................ 355/53; 355/67; 355/77; 356/401
(58) Field of Search ..................... 355/53, 67, 77; 430/5, 30, 22; 250/559.3, 548; 356/399, 400, 401; 359/888

(56) References Cited

U.S. PATENT DOCUMENTS

| 4,390,279 | * | 6/1983 | Suwa | 356/401 |
| 5,151,750 | * | 9/1992 | Magome et al. | 356/401 |
| 5,365,342 | | 11/1994 | Ayata et al. | |
| 5,486,688 | * | 1/1996 | Iima et al. | 359/888 |
| 5,572,251 | | 11/1996 | Ogawa et al. | |
| 5,689,339 | * | 11/1997 | Ota et al. | 356/401 |
| 5,734,478 | * | 3/1998 | Magome et al. | 356/401 |

FOREIGN PATENT DOCUMENTS

| 62-62519 | 3/1987 | (JP) . |
| 3-38023 | 2/1991 | (JP) . |
| 3-111706 | 5/1991 | (JP) . |
| 3-225815 | 10/1991 | (JP) . |
| 9-27449 | 1/1997 | (JP) . |

* cited by examiner

Primary Examiner—David M. Gray
Assistant Examiner—Peter B. Kim
(74) Attorney, Agent, or Firm—Frishauf, Holtz, Goodman, Langer & Chick, P.C.

(57) ABSTRACT

The exposure surface of a wafer to be exposed is formed with a wafer mark having edges for scattering incident light. The edge of the wafer mark has a curved portion whose image vertically projected upon a plane in parallel to the exposure surface has a curved shape. The surface of an exposure mask is formed with a mask mark having edges for scattering incident light. The edge of the exposure mask has a curved portion whose image vertically projected upon a plane in parallel to the surface of the exposure mask has a curved shape. The wafer and exposure mask are juxtaposed with and spaced apart by a gap from the exposure surface of the wafer. Illumination light is applied to the curved portions of the edges of the wafer and mask marks. Light scattered from the wafer and mask marks is observed along a direction oblique to the exposure surface to thereby detect a relative position of the wafer and exposure mask.

7 Claims, 14 Drawing Sheets

FIG.2A
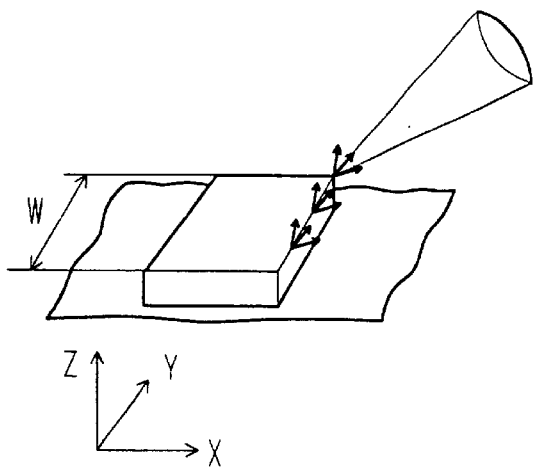
FIG.2B
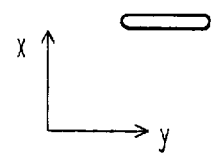
FIG.2C
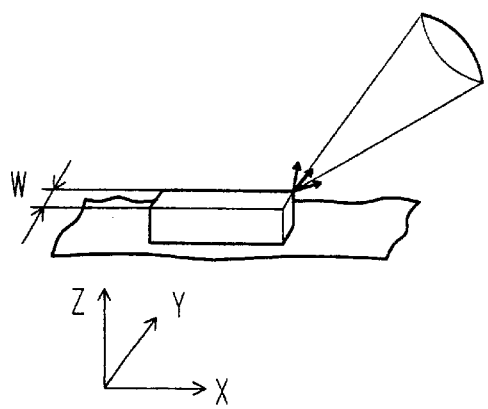
FIG.2D
o
FIG.2E
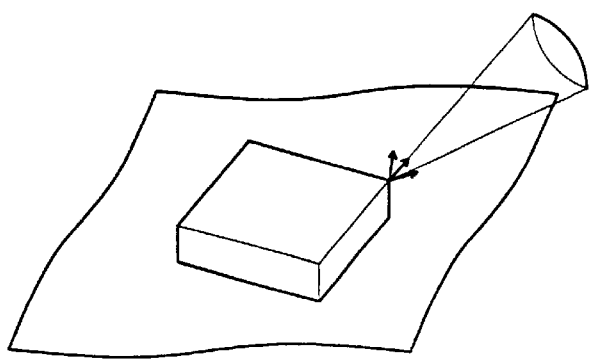

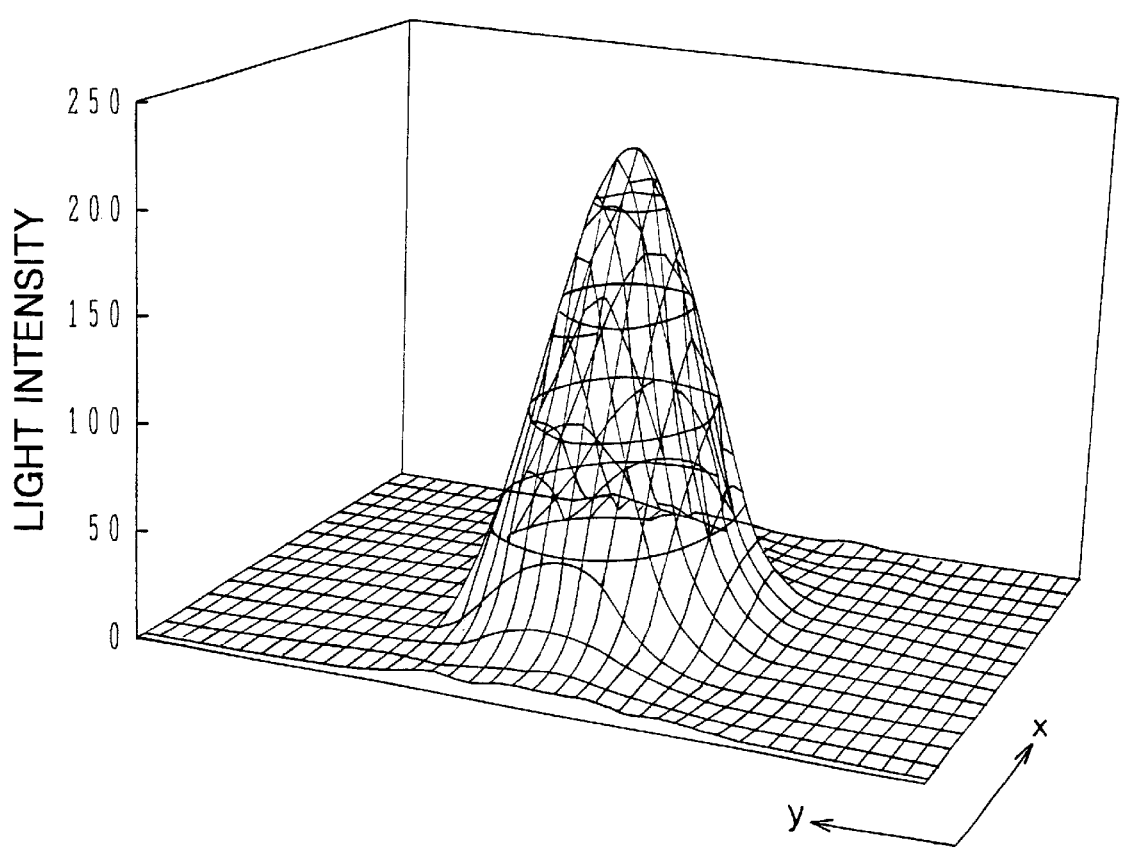

POSITION DETECTION TECHNIQUE APPLIED TO PROXIMITY EXPOSURE

This application is a Division of U.S. patent application Ser. No. 09/031,184, filed Feb. 26, 1998, now U.S. Pat. No. 6,049,373 issued on Apr. 11, 2000.

This application is based on Japanese Patent Applications No. 9-46525, 9-46526, and 9-46527 all filed on Feb. 28, 1997 and No. 9-253786 filed on Sep. 18, 1997, the entire contents of which are incorporated herein by reference.

BACKGROUND OF THE INVENTION a) Field of the Invention

The present invention relates to position detection techniques using scattered light from edges or apexes, and more particularly to a position detection method, a position detection apparatus and an alignment mark, suitable for improving throughput of proximity exposure.

b) Description of the Related Art

As the position alignment of a wafer and a mask by using an alignment system composed of a lens system and an image processing system, a vertical detection method and an oblique detection method are known. The vertical detection method observes alignment marks along a direction vertical to the mask surface, whereas the oblique detection method observes alignment marks along a direction oblique to the mask surface.

A chromatic bifocal method is known which is used as a focussing method for the vertical detection method. With this chromatic bifocal method, a mask mark formed on a mask and a wafer mark formed on a wafer are observed with light having different wavelengths, and focussed on the same flat plane by utilizing chromatic aberration of the lens system. This method can principally set an optical resolution of a lens high, so that an absolute position detection precision can be made high.

However, since alignment marks (the mask marks and the wafer marks) are observed along the vertical direction, the observing optical system enters an exposure region. If exposure is performed in this state, the optical system intercepts exposure light. It is therefore required to retract the optical system from the exposure region when exposure is performed. The time required for the optical system to retract from the exposure region lowers throughput. Further, during the exposure, the alignment marks cannot be observed and their positions cannot be detected. This may cause a low alignment precision during the exposure.

With the oblique detection method, the optical system is disposed with its optical axis being set oblique to the mask surface so that it can be located at the position not intercepting exposure light. It is therefore unnecessary to retract the optical system during exposure, and alignment marks can be observed even during exposure. It is possible to prevent position misalignment during exposure, without lowering throughput.

With this oblique detection method, however, wafer and mask marks observed obliquely are focussed so that an absolute precision of position detection is lowered by image distortions. Furthermore, since the optical axis of illumination light is not coincident with the optical axis of observation light, it is not possible to coaxially dispose both axes. Therefore, the illumination light axis becomes easy to shift from an ideal optical axis. As the illumination light axis shifts from the ideal optical axis, images are distorted and correct position detection becomes difficult.

SUMMARY OF THE INVENTION

It is an object of the present invention to provide position detection techniques capable of providing high precision alignment without lowering throughput, while allowing position detection during exposure.

According to one aspect of the present invention, there is provided a position detection method comprising the steps of: disposing a wafer having an exposure surface and an exposure mask, with a gap being set between the exposure surface and the exposure mask, the wafer having a wafer mark formed on the exposure surface, the wafer mark having edges for scattering incident light, each edge having a curved portion whose image vertically projected upon a plane in parallel to the exposure surface has a curved shape, the exposure mask having a mask mark formed on the surface thereof, the mask mark having edges for scattering incident light, each edge having a curved portion whose image vertically projected upon a plane in parallel to the surface of the exposure mask has a curved shape; and detecting a relative position of the wafer and the exposure mask by applying illumination light to the curved portions of the edges of the wafer and mask marks and by observing, along a direction oblique to the exposure surface, light scattered from the curved portions.

Since light scattered from edges is observed obliquely, the observing optical system can be configured not to enter the exposure area. It is not necessary to retract the optical system during the exposure and it is possible to observe light scattered from edges even during the exposure. Since the edge has a curved portion, a variation in the shapes and positions of edges to be caused by the influences of manufacture process variation can be reduced.

According to another aspect of the present invention, there is provided a semiconductor substrate having an exposure surface formed with a plurality of aligning wafer marks along a direction perpendicular to a plane of incident of incident light, each wafer mark having an edge for scattering the incident light, and an image of the edge vertically projected upon the exposure surface having at least a curved portion.

According to another aspect of the present invention, there is provided an exposure mask having a plurality of aligning mask marks disposed along a direction perpendicular to a plane of incident of incident light, each mask mark having an edge for scattering the incident light, and an image of the edge vertically projected upon the surface of the exposure mask having at least a curved portion.

Since an edge has a curved portion, a variation in the shapes and positions of edges to be caused by the influences of manufacture process variation can be reduced. Since a plurality of edges are disposed along a direction perpendicular to an incident surface, a plurality of images can be observed at the same time. By moving these images in parallel and superposing the images one upon another, a relative position can be easily detected.

According to another aspect of the present invention, there is provided a position detection method comprising the steps of: disposing a member with an exposure surface to be exposed and an exposure mask, with a gap being set between the exposure surface and the exposure mask, the member having an alignment mark formed on the exposure surface, the alignment mark having edges or apexes for scattering incident light, the exposure mask having a mask mark formed on the surface thereof, mask mark having edges or apexes for scattering incident light; and detecting a relative position of the member and the exposure mask by applying illumination light to the edges or apexes of the alignment and mask marks, by focussing light scattered from the alignment and mask marks on a light reception plane, and by observing images on the light reception plane, whereby a light flux scattered from one of the alignment and mask marks is attenuated or light fluxes scattered from both of the alignment and mask marks are attenuated differently so that a light intensity of an image formed by the light flux scattered from the alignment mark and focussed on the light reception plane becomes near to a light intensity of an image formed by the light flux scattered from the mask mark and focussed on the light reception plane.

Edges or apexes of the alignment and mask marks allow the scattered light to be observed, because an image is formed by a flux of scattered light in the aperture of an objective lens of the observing optical system. Further, even if illumination light is applied along a direction allowing only scattered light from edges to be incident, edge scattered light can be observed because normal reflection light from the alignment and mask marks are not incident upon the observing optical system.

Since the intensities of light scattered from the alignment and mask marks are made near to each other, image signals corresponding to images on a focal plane can be obtained at a high S/N ratio.

According to another aspect of the present invention, there is provided a position detection apparatus comprising: an illumination optical system for applying illumination light to a member having an exposure surface to be exposed and to a mask disposed in parallel to the exposure surface of the member and spaced by a gap from the exposure surface; and an observation optical system having an optical axis oblique to the exposure surface of the member, for focussing light scattered from the member and the mask onto a light reception plane, the observation optical system including an optical filter disposed just in front of the light reception plane, and a transmission factor of the optical filter is different between an area corresponding to an area where light scattered from the member is focussed and an area corresponding to an area where light scattered from the mask is focussed.

By properly selecting transmission factors of two areas of an optical filter, the intensities of images on the focal plane formed by light scattered from the alignment and mask marks are made near to each other. Accordingly, image signals corresponding to images on a focal plane can be obtained at a high S/N ratio.

According to another aspect of the present invention, there is provided a position detection apparatus comprising: an illumination optical system for applying illumination light to a wafer and a mask juxtaposed with and spaced by a gap from the wafer; a first observation optical system having an observation optical axis oblique to an exposure surface of the wafer, for focussing light reflected or scattered from the wafer and the mask upon a first light reception plane; and a second observation optical system for focussing light reflected from a partial reflection mirror disposed along the optical axis of the first observation optical system, upon a second light reception plane, the second observation optical system having a magnification factor different from a magnification factor of the first observation optical system.

Since reflected or scattered light is observed obliquely, the optical system is not necessary to be disposed in the exposure area. Accordingly, it is not necessary to retract the observing optical system during the exposure and the position detection is always possible even during the exposure.

It is possible to perform coarse position alignment by using one of the first and second observing optical systems having a lower magnification factor, and to perform fine position alignment by using the other optical system having a higher magnification factor.

According to another aspect of the present invention, there is provided a position detection method comprising the steps of: disposing a wafer with an exposure surface and a mask, with a gap being set between the exposure surface and the exposure mask, the wafer having a wafer mark formed on the exposure surface, the wafer mark having edges or apexes for scattering incident light, the mask having a mask mark having edges or apexes for scattering incident light; coarsely detecting a relative position of the wafer and the mask by applying illumination light to the edges or apexes of the wafer and mask marks and by observing light scattered from the wafer and mask marks with a first observing optical system having an observation optical axis oblique to the exposure surface; moving at least one of the wafer and the mask in accordance with the detection results obtained at the coarse relative position detecting step to coarsely align the wafer and the mask; finely detecting the relative position of the wafer and the mask by observing light scattered from the wafer and mask marks with a second observing optical system having the same observation optical axis as the first observing optical system and having a higher magnification factor than the first observing optical system; and moving at least one of the wafer and the mask to finely align the wafer and the mask, in accordance with the detection results obtained at the fine relative position detecting step.

Prior to the fine position alignment, coarse position alignment is performed by using a lower magnification factor optical system. Accordingly, a high position alignment precision is not required when the wafer and mask are first held.

According to another aspect of the present invention, there is provided a position detection method comprising the steps of: disposing a first member with a main surface and a second member juxtapose with and spaced by a gap from the main surface, the first member having a first alignment mark formed on the main surface for scattering incident light, and the second member having a second alignment mark for scattering incident light; focussing illumination light applied to the first and second marks and scattered therefrom onto a light reception plane via a converging optical system having an optical axis oblique to the main surface, whereby light receiving elements are disposed on the light reception plane in a matrix shape and the row direction of the light reception plane corresponds to a direction of a cross line between the main surface and a virtual plane perpendicular to the optical axis of the converging optical system; deriving a first partial two-dimensional image and a second partial two-dimensional image respectively similar to a reference pattern from an image formed by light scattered from the first mark and focussed on the light reception plane and from an image formed by light scattered from the second mark and focussed on the light reception plane; forming a synthesized one-dimensional image signal by accumulating in the column direction image signals of pixels in a first area including the first partial two-dimensional image and in a second area including the second partial two-dimensional image; and obtaining a relative position of the first and second marks in accordance with the synthesized one-dimensional image signal.

According to another aspect of the present invention, there is provided a position detection apparatus comprising: illumination means for applying illumination light to a first member having a main surface formed with a first alignment mark for scattering incident light and to a second member having a second alignment mark for scattering incident light, the second member being held facing the surface formed with the second mark toward the main surface; image detecting means having a light reception plane, on which pixels are disposed in a matrix shape, said image detecting means generating image signals corresponding to the pixels in accordance with intensity of light the pixels receive; converging optical system having an optical axis oblique to the main surface for focussing light scattered from the first and second marks onto the light reception plane; reference pattern storage means for storing a reference pattern; and control means for deriving a first partial two-dimensional image and a second partial two-dimensional image each similar to a reference pattern stored in the reference pattern storage means, from an image formed by light scattered from the first mark and focussed on the light reception plane and from an image formed by light scattered from the second mark and focussed on the light reception plane, forming a synthesized one-dimensional image signal by accumulating in the column direction the image signals of the pixels in a first partial area including the first partial two-dimensional image and in a second partial area including the second partial two-dimensional image, and obtaining a relative position of the first and second marks in accordance with the synthesized one-dimensional image signal.

Since scattered light is observed obliquely, it is not necessary to dispose a converging optical system in the areas where the first and second marks are formed. Accordingly, the areas of the first and second marks can be exposed without retracting the converging optical system. By accumulating image signals in the column direction, an S/N ratio can be improved. Since accumulation is performed for only partial areas, the accumulation calculation time can be shortened.

According to another aspect of the present invention, there is provided a position detection method comprising the steps of: focussing two images on a light reception plane having light receiving elements disposed in a matrix shape for generating an image signal corresponding to incident light, the two images being formed at different positions in the column direction of the light reception plane; accumulating, in the column direction, image signals of pixels in two areas each of which partially overlaps at least a portion of each of the two images; and obtaining a relative position of the two images in accordance with an image signal accumulated at the accumulating step.

According to another aspect of the present invention, there is provided a position detection apparatus comprising: a light reception plane having light receiving elements disposed in a matrix shape for generating an image signal corresponding to incident light; and control means for determining two areas each of which partially overlaps at least a portion of each of two images formed on the light reception plane, accumulating the image signals of pixels in the two areas in the column direction, and obtaining a relative position of the two images in accordance with an image signal obtained through the accumulation.

Accumulation in the column direction improves the S/N ratio. Since accumulation is performed for only partial areas, the accumulation calculation time can be shortened.

BRIEF DESCRIPTION OF THE DRAWINGS

FIGS. 2A, 2C and 2E are perspective views of wafer marks, and FIGS. 2B and 2D show images formed on a focal plane.

FIG. 5 is a diagram showing a light intensity distribution of an image of one edge of the wafer mark shown in FIG. 4A formed by light scattered therefrom.

DETAILED DESCRIPTION OF THE PREFERRED EMBODIMENTS

Prior to describing the embodiments of this invention, proposals made by the present inventor in the past (Japanese Patent Applications No. 7-294485 (JP-A 139333), and U.S. patent application Ser. No. 08/640,170, the entire contents of which are incorporated herein by reference) will be described.

Figure 1A:
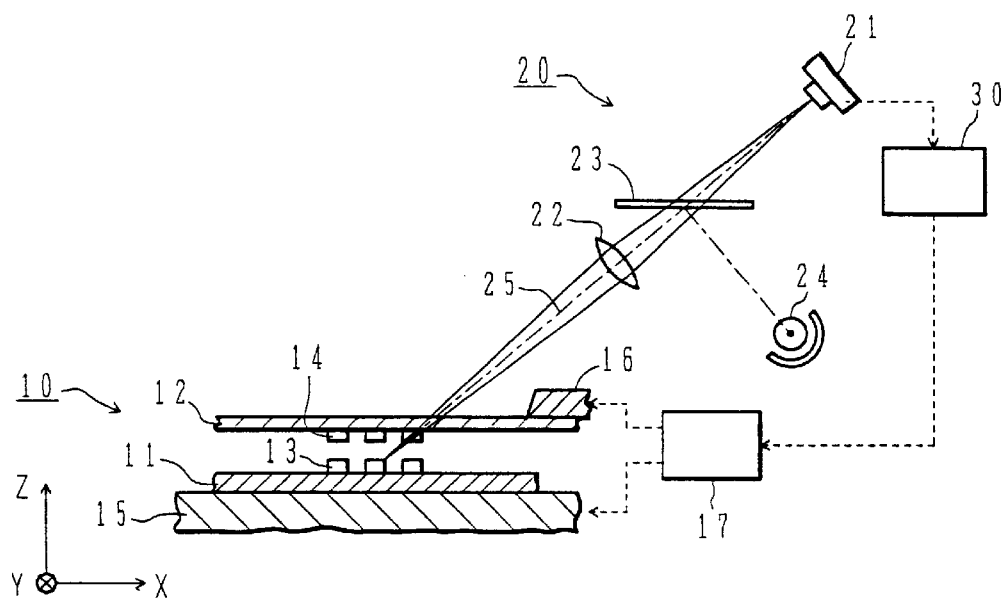
FIG. 1A is a schematic cross sectional view of a position detection apparatus used by first and second embodiments of the invention and also used by proposals made by the present inventor in the past.

FIG. 1A is a schematic cross sectional view of a position detection apparatus used by the embodiments of the invention and also used when the above proposals were made by the present inventor. The position detection apparatus is constituted of a wafer/mask holder unit 10, an optical system 20 and a controller 30.

The wafer/mask holder unit 10 includes a wafer holder 15, a mask holder 16, and a drive mechanism 17. For the position alignment, a wafer 11 is held on the upper surface of the wafer holder 15, and a mask 12 is held on the lower surface of the mask holder 16. The wafer 11 and mask 12 are disposed in parallel, with a preset gap being set between the exposure surface of the wafer 11 and the surface (mask surface) of the mask 12 on the wafer side. On the exposure surface of the wafer 11, position aligning wafer marks 13 are formed, and on the mask surface of the mask 12, a position aligning mask mark 14 is formed.

The wafer and mask marks 13 and 14 have edges or apexes for scattering incident light. Light incident upon these marks are scattered by the edges or apexes and regularly reflected by other areas. Regular reflection means the reflection that most components of incident light are reflected in the same direction.

The drive mechanism 17 can produce a relative motion of the wafer holder 15 and mask holder 16. By defining an X-axis as directing in the direction from the left to right as viewed in FIG. 1A, a Y-axis as directing in the direction vertical to the drawing sheet from the front to back thereof, and a Z-axis as directing in the direction normal to the exposure surface, the relative motion of the wafer 11 and mask 12 is possible in the X-axis, Y-axis and Z-axis directions, in a rotation direction ($\theta_z$ direction) about the Z-axis, and in rotation (flap) directions ($\theta_x$ and $\theta_y$ directions) about the X-axis and Y-axis directions.

The optical system 20 includes an image detector 21, a lens 22, a half mirror 23 and a light source 24. The optical axis 25 of the optical system 20 is set in parallel to the X-Z plane and oblique to the exposure surface. Although a single lens is shown in FIG. 1A, a plurality of lenses may be used or a relay lens may be used when necessary.

Illumination light radiated from the light source 24 is reflected by the half mirror 23, forming a light flux along the optical axis 25 which is made obliquely incident upon the exposure surface via the lens 22. The light source 24 is positioned at the focal point of the lens 22 on the image side so that the illumination light radiated from the light source 24 is collimated by the lens 22 into a parallel light flux (parallel pencil of rays). The intensity of illumination light can be adjusted at the light source.

Of the light scattered by the edges or apexes of the wafer and mask marks 13 and 14, light incident upon the lens 22 is converged by the lens 22 and focussed on a light reception plane of the image detector 21. Illumination by the optical system 20 is therefore telecentric illumination which provides the same optical axis for both illumination and observation.

The image detector 21 photoelectrically converts images of the wafer and mask marks 13 and 14 formed by light scattered from the edges or apexes and focussed on the light reception plane, into image signals which are input to the controller 30.

The controller 30 processes the image signals input from the image detector 21 to detect a relative position of the wafer and mask marks 13 and 14. The controller 30 sends a control signal to the drive mechanism 17 to make the wafer and mask marks 13 and 14 have a predetermined relative position. In accordance with this control signal, the wafer holder 15 or mask holder 16 is moved.

Figure 1B:
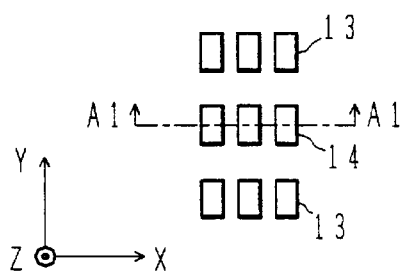
FIG. 1B is a plan view of wafer and mask marks.

FIG. 1B is a plan view showing a relative position of the wafer and mask marks 13 and 14. One mark is constituted of three rectangular patterns disposed in the X-axis direction, each side of the rectangular pattern being in parallel to the X- or Y-axis. As will be later described, three or more rectangular patterns may be disposed. The mask mark 14 is disposed between a pair of wafer marks 13.

The wafer and mask marks 13 and 14 are shown in FIG. 1A as cross sectional views taken along one-dot chain line A1—A1 shown in FIG. 1B. Illumination light incident upon the wafer and mask marks 13 and 14 is scattered by the edge of each rectangular pattern which is shown in FIG. 1B and projects along the optical axis. Light incident upon the area other than the edges is regularly reflected and is not incident upon the lens 22. The image detector 21 can therefore detect only the light scattered from the edges.

Next, the characteristics of an image formed by edge scattered light will be described.

A light intensity distribution I(x, y) of an image formed by incoherent monochromatic light is given by the following equation (1):

$$I(x, y) = \int\int O(x-x', y-y'') \cdot PSF(x', y') \, dx'dy' \quad (1)$$

where the coordinates (x, y) represent a position on the surface of an observation object, O(x, y) represents an intensity distribution of light reflected from the observation object, PSF(x, y) represents a (point spread function) of a lens, and integral is performed over the whole surface of the observation object.

If attention is drawn to one edge of each rectangular pattern shown in FIG. 1B, this edge may be considered as light reflecting fine points disposed in the Y-axis. The intensity distribution of light reflected from such a fine point is assumed as having a Dirac delta function $\delta$. It is practical to approximate the intensity distribution of light scattered from a fine point, to a delta function. Assuming that the edge extends in the Y-axis within the range where the isoplanatism of the lens is satisfied, O(x, y) can be replaced by $\delta(x)$. Therefore, the equation (1) can be represented by the following equation (2):

$$I(x) = \int\int \delta(x-x') \cdot PSF(x', y') dx'dy' \quad (2)$$
$$= \int PSF(x, y') dy'$$

where I(x) represents a line spread function of a lens, which is given by:

$$I(x) = LSF(x) \quad (3)$$

where LSF(x) represents the line spread function of the lens.

If illumination light has continuous spectra, I(x) can be given by:

$$I(x) = \int LSF\lambda(x-\Delta x\lambda) d\lambda \quad (4)$$

where $\lambda$ is a wavelength of light, LSF$\lambda$ represents the line spread function at the wavelength $\lambda$, $\Delta x\lambda$ represents a lateral shift amount of a line image caused by lens chromatic aberration at the wavelength $\lambda$, and integral is performed over the whole wavelength range.

It can be understood from the equation (4) that observation of light scattered from an edge is equivalent to observation of the line spread function of the lens. A stable image can therefore be obtained always through the observation of light scattered from the edge, without being influenced by the in-plane intensity distribution of light reflected from the observation object.

Figure 1D:
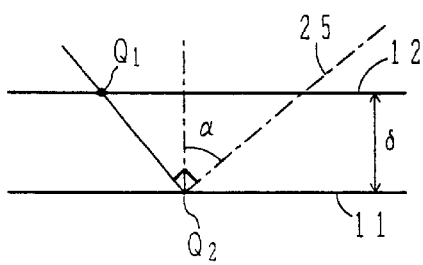
FIG. 1D is a schematic cross sectional view of the wafer and mask surfaces near at an object plane.
Figure 1C:
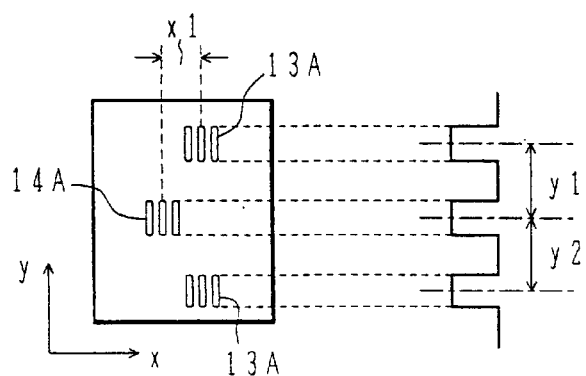
FIG. 1C is a diagram showing images of edges of the wafer and mask marks shown in FIG. 1B formed by light scattered from the edges, and a light intensity distribution on the image plane.

The left area of FIG. 1C shows the shape of an image formed by scattered light which was on the light reception plane of the image detector 21 shown in FIG. 1A. By defining the x-axis as directing in the direction (corresponding to the X-axis direction of the exposure surface) of a cross line between the plane of incident including the observation optical axis and the light reception plane, and the y-axis as directing in the direction (corresponding to the Y-axis of the exposure surface) perpendicular to the x-axis of the light reception plane, an image formed by one edge has a straight line shape parallel to the y-axis. The image of each mark therefore has a shape configured by three straight lines which are parallel to the y-axis and juxtaposed in the x-axis direction.

Between a pair of images 13A of the wafer marks 13 formed by edge scattered light, an image 14A of the mask mark 14 formed by edge scattered light appears. Since the observation optical axis is oblique to the exposure surface, the image 14A of the mask mark and the images 13A of the wafer marks are detected at different positions along the x-axis direction.

The right area of FIG. 1C shows a light intensity distribution, along the y-axis direction, of the wafer mark images 13A and the mask mark image 14A. A distance in the y-axis direction between one wafer mark image 13A and the mask mark image 14A is represented by y1, and a distance in the y-axis direction between the other wafer mark image 13A and the mask mark image 14A is represented by y2. By measuring y1 and y2, it is possible to detect a relative position of the wafer and mask marks 13 and 14 shown in FIG. 1B in the Y-axis direction, i.e., in the direction perpendicular to the plane of incident of illumination light.

For example, if the mask mark is to be positioned at the center between the pair of wafer marks in the Y-axis direction, one of the wafer and mask is moved relative to the other to make y1 and y2 have the same value. Position alignment in the Y-axis direction shown in FIG. 1B is therefore possible in this manner. Position alignment in the X-axis, Y-axis and $\theta_z$ direction can be performed by providing three sets of the alignment marks and optical systems shown in FIGS. 1A and 1B. In FIG. 1A, although the illumination and observation axes are set coaxially, it is not necessarily required to be coaxial. It is sufficient if scattered light only is incident upon an object lens of the observation system and normal reflection light is not incident.

Next, a method of measuring a gap between the exposure surface and the mask surface will be described. In an object space of the optical system, light scattered from a plurality of points on one flat plane perpendicular to the optical axis 25 is focussed at the same time on the light reception plane of the image detector 21. A plane, defined by a set of points in the object space focussed on the light reception plane, is called an "object plane".

Light scattered from each edge or apex of the wafer and mask marks on the object plane is focussed on the light reception plane, and light scattered from each edge or apex not on the object plane is not made in-focus and is defocussed more as the edge or apex becomes more apart from the object plane. Therefore, the scattered light image of an edge or apex positioned nearest to the object plane becomes clearest, and the image of another edge or apex at the position more remote from the edge or apex nearest to the object plane becomes more vague.

A distance x, shown in FIG. 1C is a distance in the x-axis direction between points in the highest in-focus state of the wafer mark image 13A and mask mark image 14A. Namely, the distance $x_1$ is generally equal to the distance between points in the highest in-focus state of the wafer and mask marks vertically projected upon the plane of incident.

FIG. 1D is a schematic cross sectional view of the wafer and mask surfaces 11 and 12 on the plane of incident near at the object plane. A point $Q_2$ is a point on a cross line between the wafer surface 11 and object plane, and a point $Q_1$ is a point on a cross line between the mask surface 12 and object plane. The length of a line segment $Q_1$–$Q_2$ corresponds to the distance $x_1$ shown in FIG. 1C.

If the length L of the line segment $Q_1$–$Q_2$ is represented by $L(Q_1, Q_2)$, the gap $\delta$ between the exposure surface 11 and mask surface 12 is given by:

$$\delta = L(Q_1, Q_2) \times \sin(\alpha) \tag{5}$$

where $\alpha$ is an angle of the optical axis 25 relative to the direction normal to the exposure surface 11. The gap $\delta$ can be known by calculating the length of the line segment $Q_1$–$Q_2$ from the measured distance $x_1$. In order to obtain a precise gap $\delta$, it is preferable to measure the distance $x_1$ precisely. To this end, it is preferable that the depth of focus is shallow. It is also preferable to dispose a number of rectangular patterns shown in FIG. 1B in the X-axis direction.

A target value of the distance $x_1$ is stored in advance in the controller 30, and the drive mechanism 17 is controlled in such a manner that the measured distance $x_1$ takes the target value. In this manner, a desired gap can be set between the exposure and mask surfaces 11 and 12.

FIG. 2A is a perspective view showing an example of one rectangular pattern of the wafer mark. Illumination light is made obliquely incident along the oblique optical axis in the X-Z plane shown in FIG. 2A, and light scattered from the edge extending in the Y-axis direction is observed. In this case, since the image formed by scattered light has the intensity distribution given by the equation (4), an image long in one direction extending along the y-axis direction of the light reception plane can be obtained as shown in FIG. 2B. This image has the line spread function of a lens.

FIG. 2C shows another pattern having a shorter length in the Y-axis direction than the rectangular pattern shown in FIG. 2A. If the length of an edge is shorter than the lens resolution, the intensity distribution O(x, y) of reflected light in the equation (1) may possibly be replaced by $\delta(x, y)$. Therefore, the equation (1) is changed to:

$$I(x, y) = \int\int \delta(x - x', y - y') \cdot PSF(x', y') dx' dy' \tag{6}$$
$$= PSF(x, y)$$

where PSF(x, y) is a point spread function of a lens.

If illumination light has continuous spectra, I(x, y) is given by:

$$I(x, y) = \int PSF\lambda(x - \Delta x\lambda, y - \Delta y\lambda) d\lambda \tag{7}$$

where $\lambda$ is a wavelength of light, PSF$\lambda$ represents the point spread function at the wavelength $\lambda$, $\Delta x\lambda$ represents a lateral shift amount in the x-axis direction of a point image caused by lens chromatic aberration at the wavelength $\lambda$, $\Delta y\lambda$ represents a lateral shift amount in the y-axis direction of a point image caused by lens chromatic aberration at the wavelength $\lambda$, and integral is performed over the whole wavelength range.

By setting the length of an edge equal to or shorter than the resolution of a lens, it is possible to obtain a point image approximated to the point spread function of a lens shown in FIG. 2D.

FIG. 2E is a perspective view of a rectangular pattern wherein light is scattered from a position near at the apex on which three planes are intersected. An image formed by light scattered from a position near at the apex shown in FIG. 2E can presumably be approximated to the point spread function given by the equations (6) and (7). In this specification, a unit of a pattern having an edge or apex from which light is scattered is called an edge pattern.

Figure 3:
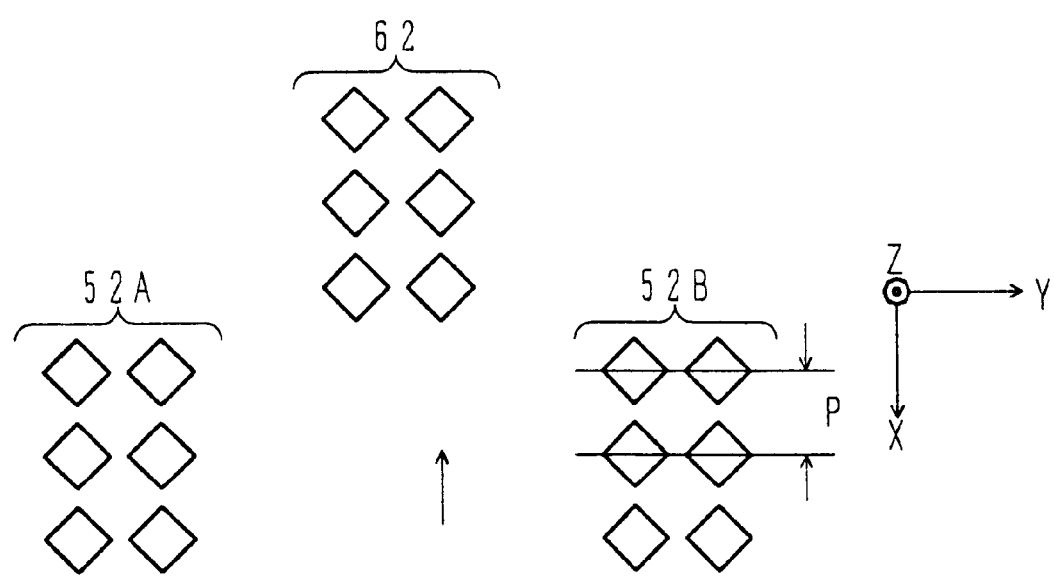
FIG. 3 is a plan view showing wafer and mask marks having apexes from which illumination light is scattered.

FIG. 3 shows an example of the layout of mask and wafer marks having apexes from which illumination light is scattered. A mask mark 62 is disposed between wafer marks 52A and 52B. Each of the alignment marks 52A, 52B and 62 is formed by disposing an edge pattern of a square plane shape on three rows in the X-axis direction at a pitch P and on two columns in the Y-axis direction. One apex of each edge pattern of a square plane shape is directed to the positive X-axis direction, i.e., toward the observation optical system.

By using the layout of edge patterns shown in FIG. 3 having apexes from which illumination light is scattered and by observing light scattered from the apexes, position alignment of a wafer and a mask can be achieved also by the method described with FIGS. 1A to 1C.

Next, the position detection method according to the first embodiment of the invention will be described. The oblique detection optical system used by the first embodiment is the same as that shown in FIG. 1A. Position alignment through observation of light scattered from a linear edge has been described with reference to FIGS. 1B and 2A, and position alignment through observation of light scattered from an apex has been described with reference to FIGS. 2E and 3. In this embodiment, light is observed which is scattered from an edge whose image vertically projected upon the exposure surface or mask surface is a curved line.

Figure 4A:
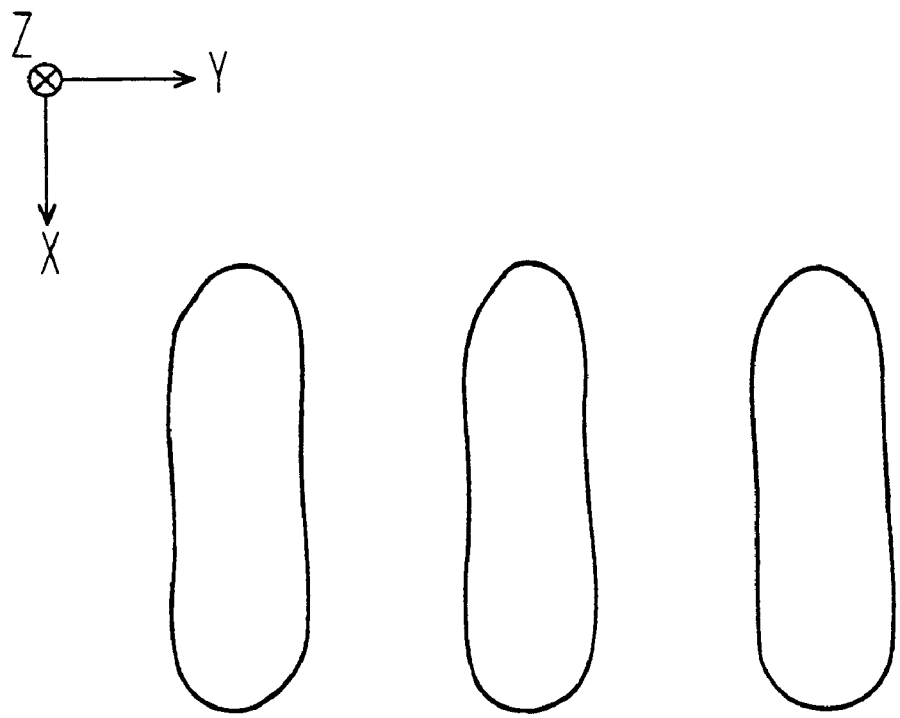
FIGS. 4A and 4B are respectively plan views and perspective views showing edge patterns constituting a wafer mark according to the first embodiment of the invention.
Figure 4B:
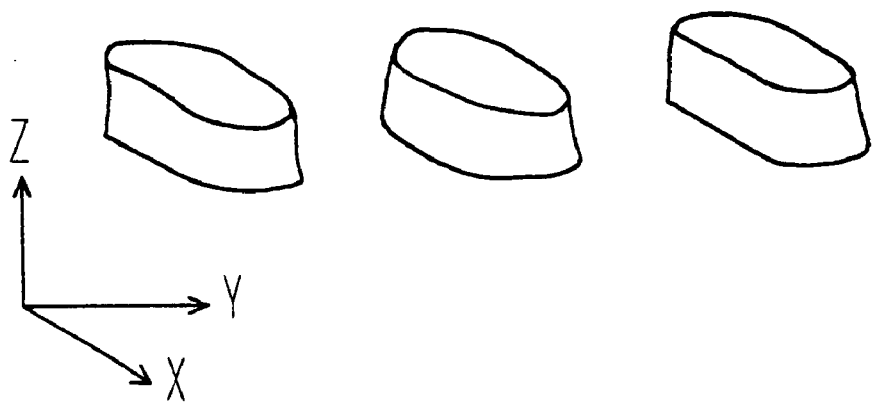

FIG. 4A is a plan view of a wafer mark having curved edges, and FIG. 4B is a perspective view of the wafer mark. This wafer mark is formed by patterning a $Ta_4B$ film deposited on an SiC layer formed on a silicon substrate surface, and is constituted of three edge patterns having a mesa structure of about 3 $\mu$m length and about 1 $\mu$m width. Opposite ends of each edge pattern have a semicircular shape with a radius of curvature of about 0.5 $\mu$m. An X-ray mask can be formed by removing the silicon substrate at a window region through etch-back and by leaving the SiC layer.

In observing edge scattered light from the wafer mark shown in FIG. 4A, the silicon substrate is held by the wafer holder 15 shown in FIG. 1A in such a manner that the longitudinal direction of the edge pattern, the in-plane direction perpendicular to the longitudinal direction, and the substrate normal direction become coincident with the X-, Y- and Z-axes shown in FIG. 1A. Light scattered from the curved edge having a radius of curvature of about 0.5 $\mu$m is then observed.

FIG. 5 shows the measurement results of a light intensity distribution of scattered light from one curved edge of the wafer mark shown in FIGS. 4A and 4B, as observed with the oblique detection optical system shown in FIG. 1A. The ordinate represents a light intensity, and the abscissa represents the Y-axis on the silicon substrate surface. Namely, the abscissa direction corresponds to the y-axis shown in FIG. 1C, the width direction corresponds to the X-axis. The magnification factor of the lens of the observation optical system was 100, the numerical aperture (NA) of the object lens was 0.35, and the illumination light was while.

As shown in FIG. 5, the image of scattered light from the curved edge has generally a point-like shape and takes a maximum light intensity generally at one point. Namely, an image similar to that of scattered light from an apex of a wafer mark can be obtained.

The position of the apex such as shown in FIG. 2E is susceptible to the influences of manufacture process variation when the wafer mark is formed. In contrast, the position of the curved edge is not susceptible to the influences of manufacture process variation, so that high precision position alignment can be performed stably. In the example shown in FIGS. 4A and 4B, each edge of the wafer mark has a semicircular shape. This shape may be any other gentle curve so long as an image of generally a point-like shape can be obtained. In forming a wafer mark having such a gentle curve, the outer periphery of an edge pattern of a wafer mark is not necessarily required to be gentle. For example, a photomask having a rectangular window may be used and the outer periphery of the resist pattern is made smooth by utilizing diffraction of exposure light.

The radius of curvature of each edge of the wafer mark shown in FIGS. 4A and 4B was about 0.5 $\mu$m which was generally the same as the lens resolution. By setting the radius of curvature of each edge generally equal to or smaller than the resolution, an image of edge scattered light becomes almost a point-like shape. It is therefore preferable to set the radius of curvature of each edge generally equal to or smaller than the lens resolution, in order to perform high precision position alignment. This does not imply that an edge having a radius of curvature larger than the lens resolution cannot be used. It is preferable to be empirically determined which radius of curvature is suitable for obtaining a desired position alignment precision, by using edges of various shaped.

Figure 6A:
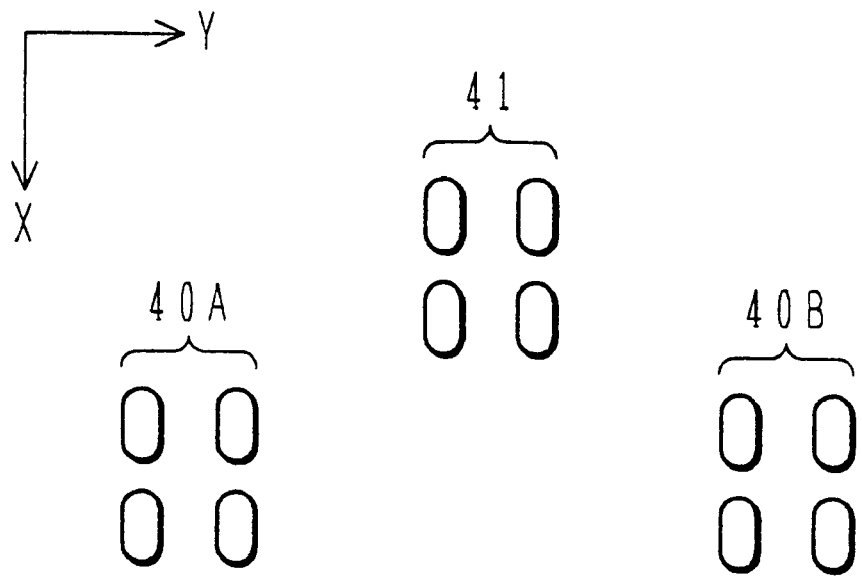
FIGS. 6A and 6B are plan views showing examples of the layouts of wafer and mask marks according to the first embodiment of the invention.
Figure 6B:
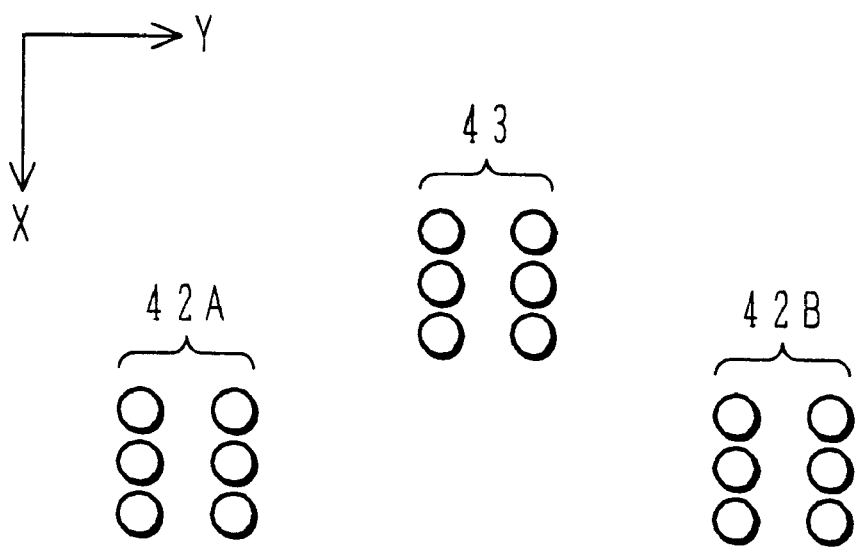

FIGS. 6A and 6B show examples of the layouts of mask and wafer marks. In these two examples, two wafer marks 40A and 40B and two wafer marks 42A and 42B are disposed in the Y-axis direction, and mask marks 41 and 43 are disposed between the wafer marks 40A and 40B and between the wafer marks 42A and 42B, respectively.

Each of the alignment marks 40A, 40B and 41 shown in FIG. 6A is constituted of edge patterns having a circular plane shape long in the X-axis direction disposed on two rows in the X-axis direction and on two columns in the Y-axis direction.

Each of the alignment marks 42A, 42B and 43 shown in FIG. 6B is constituted of edge patterns having a circular plane shape disposed on three rows in the X-axis direction and on two columns in the Y-axis direction.

By using the layout of edge patterns with gentle curve shown in FIGS. 6A and 6B and observing light scattered from such edges, position alignment of a wafer and a mask can be achieved also by the method described with FIGS. 1A to 1C. The alignment marks shown in FIGS. 6A and 6B are configured to allow one alignment mark to be superposed on another alignment mark, by moving the marks in parallel to each other after position alignment. It is therefore easy to measure the distance between alignment marks in the Y-axis direction. By disposing a plurality of edge patterns in the X-axis direction at a predetermined pitch, it becomes easy to focus some edge among a plurality of edge patterns and stably detect the relative position. For example, the relative position of the wafer and the mask can be detected using the same alignment marks and the same position detection apparatus even if the gap between the wafer and the mask changes. Further, the relative position can be detected while the gap is changing. The gap between a wafer and a mask can be detected by the method described with FIG. 2D.

Figure 7A:
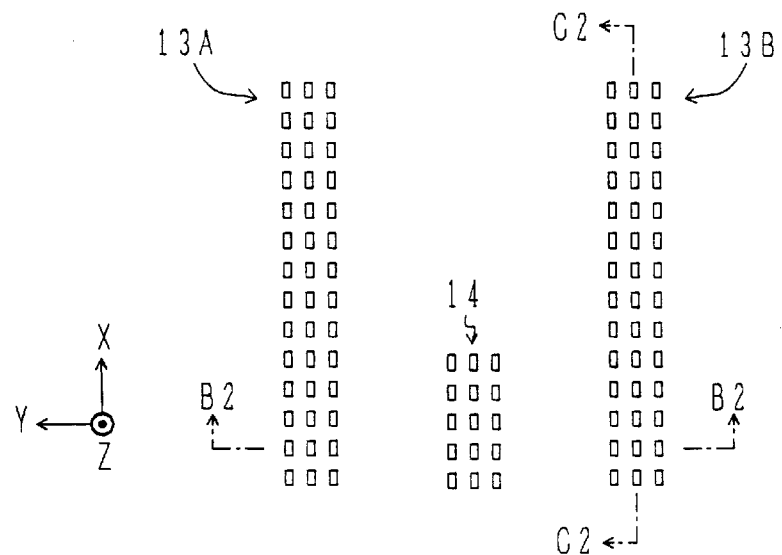
FIG. 7A is a plan view of wafer and mask marks.

FIG. 7A is a plan view showing another example of a relative position of wafer marks 13A and 13B and a mask mark 14. Each of the wafer marks 13A and 13B is constituted of rectangular patterns disposed in a matrix form, three patterns in the Y-axis direction and fourteen patterns in the X-axis direction. The mask mark 14 is constituted of similar rectangular patterns disposed in a matrix form, three patterns in the Y-axis direction and five patterns in the X-axis direction. In the state after the position alignment is completed, the relative position is established in which the mask mark 14 is positioned at generally the center in the Y-axis direction between the wafer marks 13A and 13B.

The longer side of each rectangular pattern of the wafer marks 13A and 13B and the mask mark 14 is parallel to the X-axis, and the shorter side thereof is parallel to the Y-axis. The longer side of each rectangular pattern is 2 µm long and the shorter side is 1 µm long. The pitch between rectangular patterns of each mark is 4 µm both in the X- and Y-axis directions. The distance between centers of the wafer marks 13A and 13B is 56 µm.

Figure 7B:
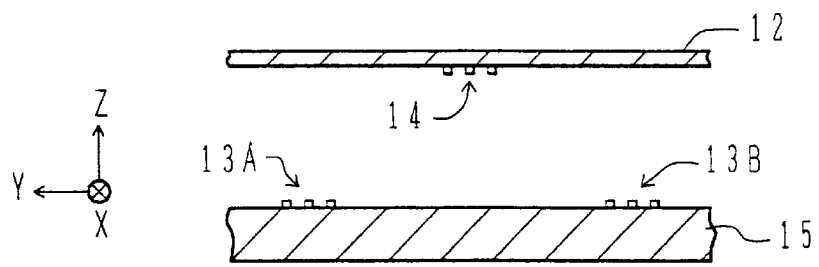
FIG. 7B is a cross sectional view taken along one-dot chain line B2—B2 of FIG. 7A.

FIG. 7B is a cross sectional view taken along one-dot chain line B2—B2 shown in FIG. 7A. For example, the wafer marks 13A and 13B are formed by patterning an SiN film, a polysilicon film or the like formed on the exposure surface, and the mask mark 14 is formed by patterning a $Ta_4B$ film formed on the mask surface of a membrane 12 made of SiC or the like.

Figure 7C:
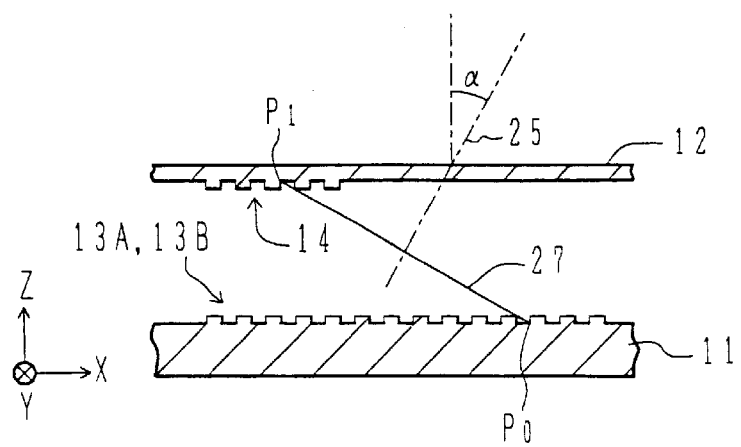
FIG. 7C is a cross sectional view taken along one-dot chain line C2—C2.

FIG. 7C is a cross sectional view taken along one-dot chain line C2—C2 shown in FIG. 7A. Illumination light incident upon the wafer and mask marks 13A, 13B and 14 along the optical axis 25 is scattered by the shorter side edge of each rectangular pattern shown in FIG. 7C. Light incident upon the area other than the edges is regularly reflected and is not incident upon the lens 22 shown in FIG. 1A. The image detector 21 can therefore detect only the light scattered from the edges.

Light scattered from points on the object plane 27 of the optical system 20 shown in FIG. 1A is focussed at the same time on the light reception plane of the image detector 21.

In FIG. 7C, light scattered from each edge of the wafer and mask marks 13A, 13B and 14 on the object plane 27 is focussed on the light reception plane, and light scattered from each edge not on the object plane is not made in-focus and is defocussed more as the edge becomes more apart from the object plane. Therefore, the scattered light image of an edge positioned nearest to the object plane becomes clearest, and the image of another edge at the position more remote from the edge nearest to the object plane becomes more vague.

Figure 8:
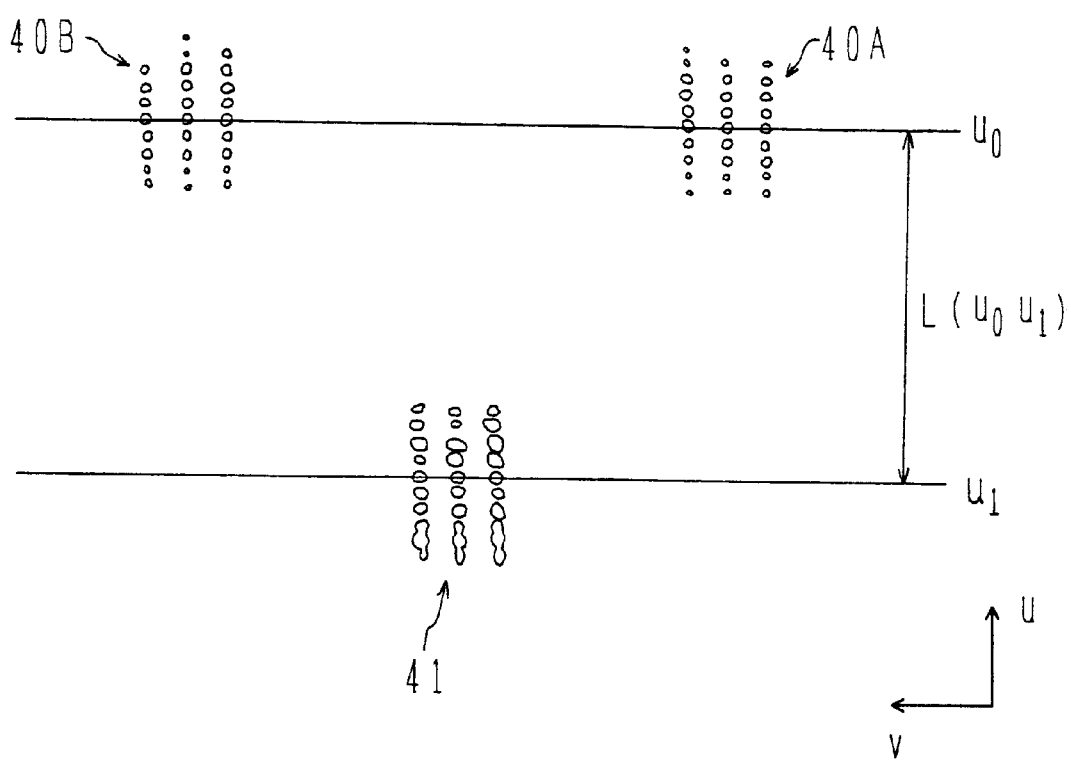
FIG. 8 is a sketch of images of wafer and mask marks shown in FIG. 7A and formed by light scattered from the marks.

FIG. 8 is a sketch of images on the light reception plane formed by light scattered from edges. A u-axis shown in FIG. 8 corresponds to the direction of a cross line between the object plane 27 shown in FIG. 7C and the X-Z plane, and a v-axis corresponds to the Y-axis shown in FIG. 7C. Images 40A and 40B formed by light scattered from the wafer marks 13A and 13B appear separately along the v-axis direction, and an image 41 formed by light scattered from the mask mark 14 appears between the images 40A and 40B.

Since light scattered from the front and back edges of each rectangular pattern is observed, two point-like images appear for each rectangular pattern. Images formed by light scattered from the edges near at the object plane 27 shown in FIG. 7C are clear, and images formed by light scattered from edges more apart from the edges near at the object plane 28 becomes more vague. Furthermore, since the observation axis 25 is oblique to the exposure surface, the position of the images 40A and 40B in the highest in-focus state formed by light scattered from the wafer marks is not coincident in the u-axis direction with the position of the image 41 in the highest in-focus state formed by light scattered from the mask mark.

By moving the wafer holder 15 and mask holder 16 shown in FIG. 1A to position the image 41 formed by light scattered from the mask mark at the center between the images 40A and 40B formed by light scattered from the wafer mark, along the Y-axis direction, position alignment of the wafer 11 and mask 12 can be performed.

Since the position detection apparatus shown in FIG. 1A obliquely observes the wafer and mask marks, it is not necessary to set the optical system 20 in the exposure range so that the optical system 20 is not required to be retracted during exposure. It is also possible to always detect the position while the wafer is exposed after the position alignment. Still further, since the illumination and observation axes are coaxial, there is no axial shift and an image can be obtained always stably.

The second embodiment of the invention will be described next.

Figure 9A:
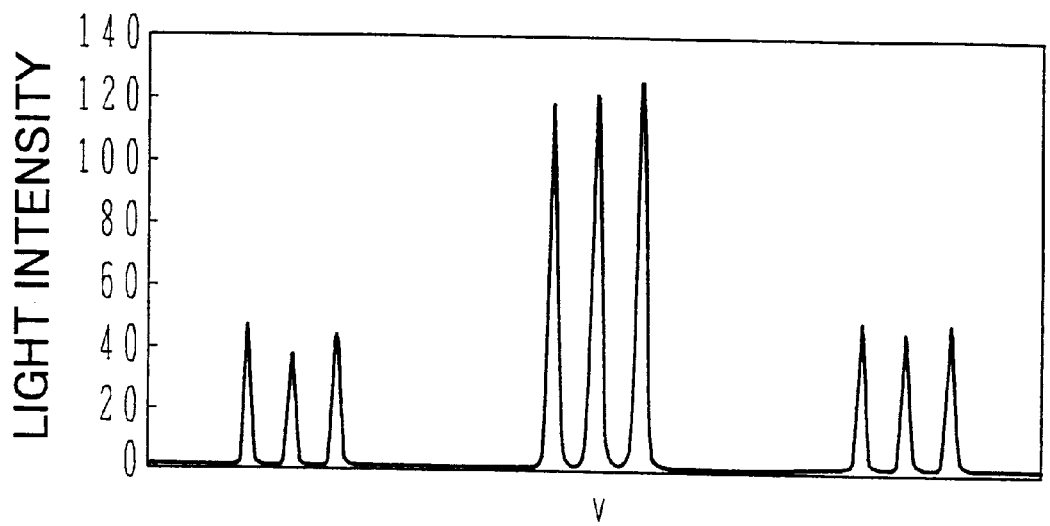
FIGS. 9A and 9B are graphs showing image signals illustrating the second embodiment in which wafer marks are made of different materials.
Figure 9B:
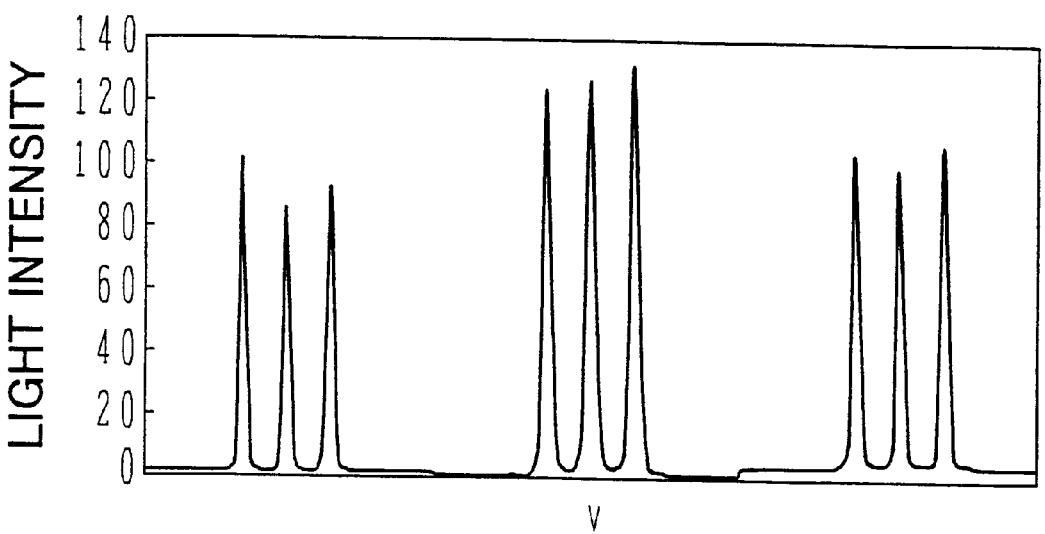

FIGS. 9A and 9B show examples of image signals obtained by the image detection apparatus 21 shown in FIG. 1A. The abscissa corresponds to the v-axis shown in FIG. 8, and the ordinate represents to a light intensity. Image signals were obtained by scanning in the v-axis direction and after each v-axis scan by moving the scan position by a predetermined distance in the u-axis direction. Of these image signals, the image signals shown in FIG. 8 were obtained by scanning the images 40A and 40B at the position in the highest in-focus state and by scanning the image 41 at the position in the highest in-focus state.

The image signals shown in FIG. 9A were obtained with the wafer marks made of polysilicon, and the image signals shown in FIG. 9B were obtained with the wafer marks made of SiN. The mask marks were both made of $Ta_4B$.

As shown in FIGS. 9A and 9B, three peaks corresponding to the mask mark appear at generally the central area, and three peaks corresponding to the wafer mark appear on both sides of the mask mark peaks.

An example of a method of detecting a relative position of a mask mark and a wafer mark by using the waveforms shown in FIGS. 9A and 9B will be briefly described. While the peak waveforms of the mask mark are shifted in the v-axis direction, correlation factors between the peak waveforms of the mask mark and the peak waveforms of the two wafer marks are calculated. The distance between the centers of the wafer and mask marks corresponds to the shift amount at which the largest correlation factor was calculated.

Position alignment of the wafer and mask in the Y-axis direction shown in FIG. 1A can be performed by moving the wafer and mask holders to make equal the distances from the peak waveforms of the mask mark to the peak waveforms of the wafer marks on both sides of the mask mark.

In order to improve the calculation precision of correlation factor, it is preferable to use photoelectric conversion elements disposed on the light reception plane, in the approximately linear area of the input/output characteristics of the elements, and to obtain image signals of high S/N ratio. From these viewpoints, it is preferable to make the height of waveform peaks of both the mask and wafer marks generally equal. However, light scattered from a wafer mark and light scattered from a mask mark have generally different intensities because of difference of materials of the membrane 12 and difference between materials of wafer and mask marks shown in FIG. 7C, or other reasons. Therefore, as shown in FIGS. 9A and 9B, the heights of peaks of the mask mark are different from the heights of peaks of the wafer mark.

Figure 10A:
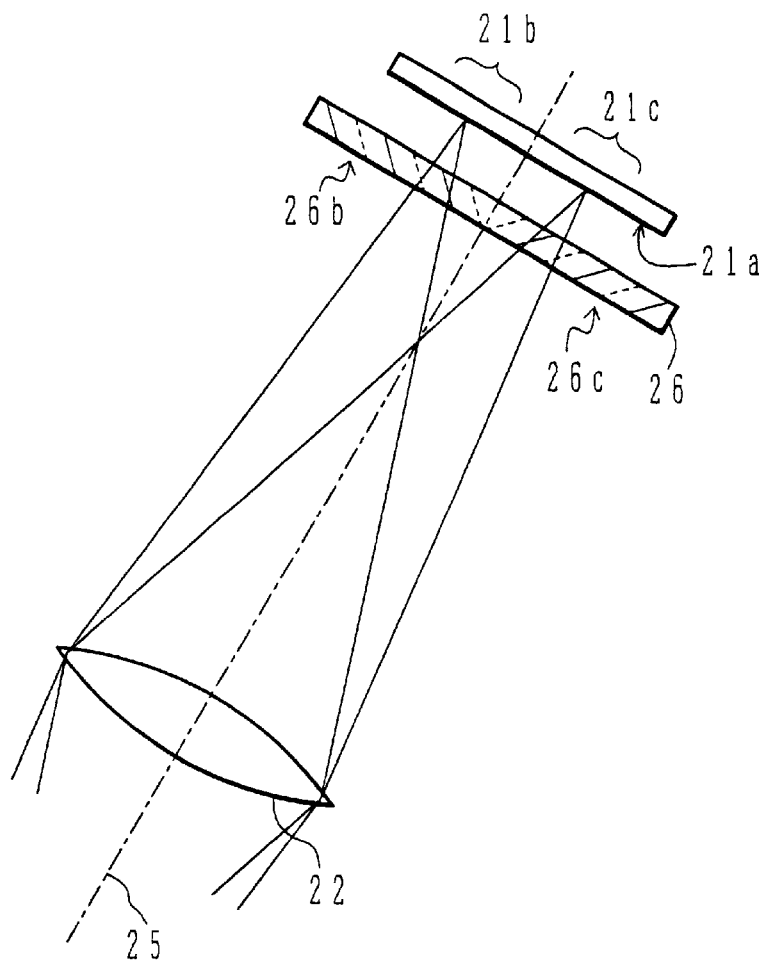
FIG. 10A is a cross sectional view showing a region near a focal plane of the position detection apparatus according to the second embodiment of the invention.
Figure 10B:
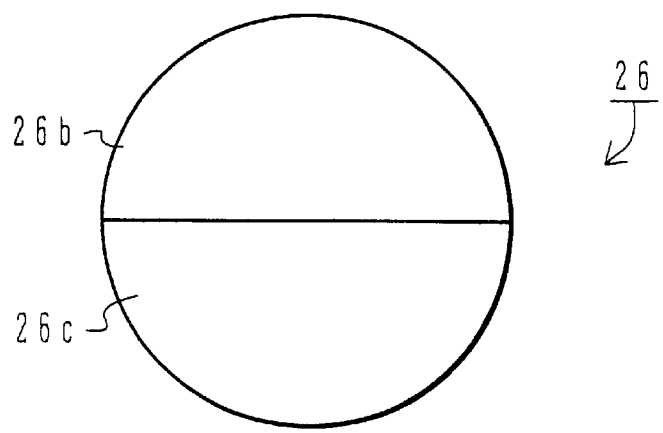
FIG. 10B is a front view of an optical filter shown in FIG. 10A.

By utilizing the method of the second embodiment of the invention, a height difference of peaks between the mask and wafer marks can be reduced. With reference to FIGS. 10A and 10B, the position detection method and apparatus according to the second embodiment will be described.

FIG. 10A is a cross sectional view showing the region near a light reception plane 21a of the position detection apparatus shown in FIG. 1A. An optical filter 26 is disposed just in front of the light reception plane 21a perpendicular to the optical axis 25. An image formed by light scattered from the wafer mark 13 is focussed in an area 21b of the light reception plane 21a, and an image formed by light scattered from the mask mark 14 is focussed in an area 21c. The focussing areas may be reversed depending upon the optical system.

A transmission factor of the optical filter 26 is different at the areas 26b and 26c corresponding to the areas 21b and 21c respectively. FIG. 10B is a front view of the optical filter 26. Areas 26b and 26c having different transmission factors are defined in the upper and lower halves of a circular glass plate. Even if the intensities of light scattered from the wafer and mask marks and transmitted through the lens 22 are different, the intensities of two scattered light fluxes focussed upon the light reception plane 21a can be made near to each other by properly setting the transmission factors of the two areas of the optical filter 26.

As the intensities of light scattered from the wafer and mask marks and focussed upon the light reception plane 21a are made near to each other, the heights of peaks of the image signals shown in FIGS. 9A and 9B corresponding to the mask and wafer marks can be made near to each other. It is therefore possible to detect the position more precisely. The optical filter 26 is preferably a filter having the characteristics that optical paths of light scattered from the wafer and mask marks do not become different.

The oblique detection optical system does not use light diffraction. It is therefore preferable to use white light in order to avoid the influence of light interference. Therefore, the optical filter 26 is preferably a neutral density filter having a small wavelength dependency upon transmission factor. This neutral density filter is also convenient in that a transmission factor of each of a plurality of divided areas of one filter can be easily changed.

It is preferable that the optical filter 26 is set along the optical axis to the position where the light flux scattered from the wafer mark is perfectly separated from the light flux scattered from the mask mark. Therefore, the optical filter may be disposed not just in front of the light reception plane 21a, but at any position so long as two scatted light fluxes are perfectly separated.

In FIGS. 10A and 10B, light scattered from the mask mark and light scattered from the wafer mark are focussed via the areas of the optical filter having different transmission factors. One scattered light flux may be attenuated by the filter and the other scattered light flux may be focussed without passing through the filter. In this case, a filter is disposed only in one of the areas 21b and 21c shown in FIG. 10A.

In the second embodiment, position detection is performed by calculating correlation factors of one-dimensional image signals.

The relative position of a mask and a wafer may be calculated by using two-dimensional image signals shown in FIG. 8. In this case, pattern matching of similarity between the mask and wafer mark images is performed by moving the image signals in parallel to the u-axis and v-axis directions. With this pattern matching of the two-dimensional image signals, a distances between images in the u- and v-axis directions can be calculated.

Next, a method of measuring a distance between a wafer and a mask will be described. In FIG. 8, a position $u_0$, where the images 40A and 40B formed by light scattered from the wafer marks provide the highest in-focus state in the u-axis direction, corresponds to a cross line $P_0$ between the object plane 27 and the exposure surface shown in FIG. 7C. Also in FIG. 8, a position $u_1$, where the image 41 formed by light scattered from the mask mark provides the highest in-focus state in the u-axis direction, corresponds to a cross line $P_1$ between the object plane 27 and the mask surface shown in FIG. 7C. For example, a distance between the positions $u_0$ and $u_1$ can be obtained through pattern matching of the two-dimensional images shown In FIG. 8.

By representing the length of the line segmenBt $P_0$–$P_1$ by $L(P_0, P_1)$, the gap $\delta$ between the wafer 11 and mask 12 is given by:

$$\delta = L(P_0, P_1) \times \sin(\alpha) \tag{8}$$

where $\alpha$ is an angle of the optical axis 25 relative to the direction normal to the exposure surface. The gap $\delta$ can therefore be calculated from the length of the line segment $P_0$–$P_1$ by measuring the distance $L(u_0, u_1)$ between the positions $u_0$ and $u_1$ in the u-axis direction shown in FIG. 8. In order to calculate the gap $\delta$ more precisely, it is preferable to correctly measure the distance between the positions $u_0$ and $u_1$ in the U-axis direction. To this end, the depth of focus of the lens is preferably shallow.

Without performing pattern matching between two observed images, each observed image may be pattern matched with a reference image. In this case, reference image signals are formed on the assumption that a wafer and a mask are disposed to satisfy a desired relative position, and stored in a memory in advance. By performing pattern matching of similarity between an observed wafer mark and a pre-stored reference wafer mark, a shift amount of the observed wafer mark from a reference position is obtained. Similar to the wafer mark, a shift amount of a mask pattern from a reference position is obtained. From these shift amounts, a relative position between the wafer and mask can be known.

Next, the third embodiment of the invention will be described.

Figure 11:
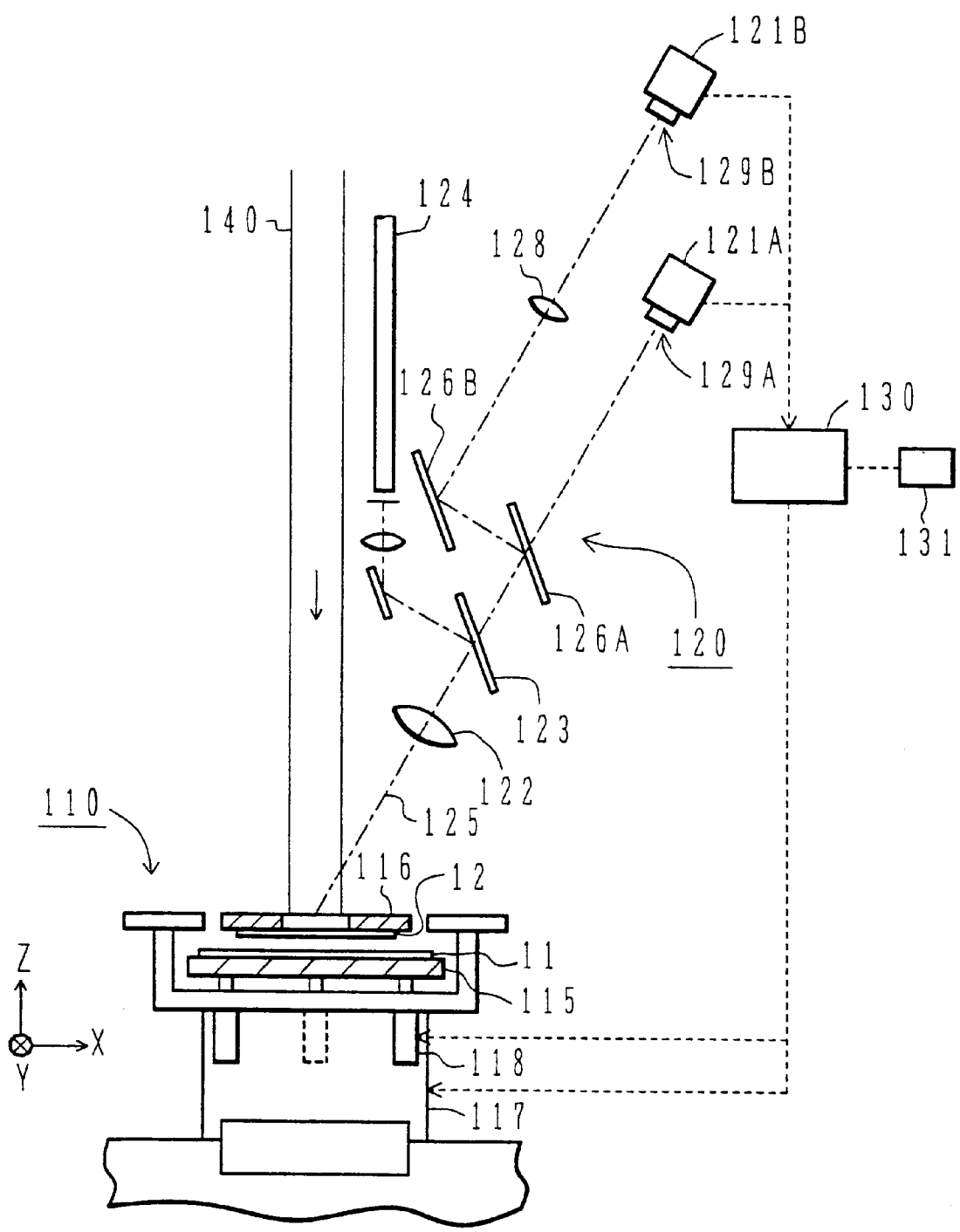
FIG. 11 is a diagram showing the fundamental structure of a position detection apparatus used by third and fourth embodiments of the invention.

FIG. 11 is a schematic cross sectional view of a position detection apparatus according to the third embodiment of the invention. The position detection apparatus of this embodiment is constituted of a wafer/mask holder unit 110, an optical system 120 and a controller 130.

The wafer/mask holder unit 110 includes a wafer holder 115, a mask holder 116, and drive mechanisms 117 and 118. For the position alignment, a wafer 11 is held on the upper surface of the wafer holder 115, and a mask 12 is held on the lower surface of the mask holder 116. The wafer 11 and mask 12 are disposed in parallel, with a preset gap being set between the exposure surface of the wafer 11 and the surface (mask surface) of the mask 12 on the wafer side. On the exposure surface of the wafer 11, position aligning wafer marks are formed, and on the mask surface of the mask 12, a position aligning mask mark is formed.

The drive mechanism 117 can move the wafer holder 115 or mask holder 116 to change a relative position of the wafer 11 and mask 12 on the exposure surface. The drive mechanism 118 can move the wafer holder 115 to change the gap between the exposure surface of the wafer 11 and the mask surface of the mask 12. By defining an X-axis as directing in the direction from the left to right as viewed in FIG. 11, a Y-axis as directing in the direction vertical to the drawing sheet from the front to back thereof, and a Z-axis as directing in the direction normal to the exposure surface, the drive mechanism 117 adjusts the relative position of the wafer 11 and mask 12 in the X-axis and Y-axis directions and in a rotation direction ($\theta_z$ direction) about the Z-axis, whereas the drive mechanism 118 adjusts the relative position of the wafer 11 and mask 12 in the Z-axis direction and in rotation (flap) directions ($\theta_x$ and $\theta_y$ directions) about the X-axis and Y-axis directions.

The optical system 120 includes image detectors 121A and 121B, lenses 122 and 128, half mirrors 123 and 126A, an optical fiber 124, and a mirror 126B. The optical axis 125 of the optical system 120 is set in parallel to the X-Z plane and oblique to the exposure surface.

Illumination light radiated from the optical fiber 124 is reflected by the half mirror 123, forming a light flux along the optical axis 125 which is made obliquely incident upon the exposure surface via the lens 122. The illumination light transmitted through the lens is changed to a parallel light flux (parallel pencil of rays).

The illumination light is scattered from a scattering area such as an edge and apex of the wafer and mask marks formed on the wafer 11 and mask 12. Of the scattered light, light incident upon the lens 122 is converged by the lens 122 and a fraction thereof transmits through the half mirrors 123 and 126A and is focussed on a light reception plane 129A of the image detector 121A. A magnification factor of an image focussed upon the light reception plane 129A is, for example, 20. Of the scattered light, light reflected by the half mirror 126A is reflected by the mirror 126B, converged by a relay lens 128, and focussed upon a light reception plane 129B of the image detector 121B. A magnification factor of an image focussed upon the light reception plane 129B is, for example, 80 to 100. The two observation systems having different magnification factors are disposed in the above manner.

The image detectors 121A and 121B photoelectrically convert images formed by light scattered from the wafer 11 and mask 12 and focussed on the light reception planes 129A and 129B, into image signals which are input to the controller 130.

The controller 130 processes the image signals supplied from the image detectors 121A and 121B by referring to reference patterns stored in a reference pattern memory 131 to detect a relative position of the wafer 11 and mask 12 in the Y-axis direction.

The relative positions of the wafer 11 and mask 12 in the X- and Y-axis directions and in the $\theta_z$ direction can be detected by disposing the two optical systems having an oblique optical axes parallel to the X-Z plane and one optical system having an oblique optical axis parallel to the Y-Z plane.

Control signals are supplied to the drive mechanisms 117 and 118 to make the wafer 11 and mask 12 have a predetermined relative position. In accordance with the control signal, the drive mechanism 117 moves the wafer holder 115 in parallel to the X-Y plane to rotate it about the Z-axis. In accordance with the control signal, the drive mechanism 118 moves the wafer holder 115 in parallel to the Z-axis direction to slightly rotate it about the X- and Y-axes.

Position alignment of the wafer 11 and mask 12 shown in FIGS. 7A to 7C will be described by using the position detection apparatus shown in FIG. 11.

Light scattered from points on an object plane of the optical system 120 shown in FIG. 11 is focussed at the same time upon the light reception planes 129A and 129B of the image detectors 121A and 121B.

The depth d of focus of the converging optical system 120 is given by:

$$d = \lambda/NA^2 \quad (9)$$

where NA is a numerical aperture of the object lens of the converging optical system 120, and $\lambda$ is a wavelength of illumination light. Light scattered from edges positioned in the depth d of focus centered to the object plane 27 is focussed upon the light reception planes 129A and 129B of the image detectors 121A and 121B. As shown in FIG. 7A, a plurality of edges of the wafer marks 13A and 13B and the mask mark 14 are disposed along the X-axis direction, so that light scattered from some of these scattering areas is focussed upon the light reception planes. In FIG. 7C, light scattered from an edge outside of the depth d of focus is not made in-focus on the light reception plane, and the images formed by light scattered from the areas more spaced from the object plane 27 become more out-of-focus.

The relative position of the wafer and mask can be known similarly to the second embodiment described with reference to FIGS. 7A to 9B.

A precision of position alignment in the Y-axis direction of the position detection apparatus shown in FIG. 11 becomes more severe as the integration degree of semiconductor integrated circuit devices becomes higher. For example, in the case of a dynamic RAM having a storage capacity of 16 G bits, a position alignment precision of about 12.5 nm is required.

In order to perform position alignment by using the image signals shown in FIG. 9A or 9B, an error of the relative position of the wafer and mask when the image signals are detected is preferably set within some range. However, it is difficult to hold the mask 12 by the mask holder 116 shown in FIG. 11 at a precision within this error range, while the wafer 11 is held by the wafer holder 115. It is therefore preferable to first perform coarse alignment to realize a precision within this error range, after the wafer 11 and mask 12 are held.

Such coarse alignment can be performed easily based upon the image signals of images of a low magnification factor focussed upon the light reception plane 129A. After the completion of this coarse alignment, fine alignment at a higher precision is performed based upon the image signals of images of a high magnification factor focussed upon the light reception plane 129B. Since the coarse alignment is performed prior to the fine alignment, the position alignment precision required when the wafer and mask are held, can be lowered.

As the integration degree of semiconductor integrated devices becomes high, the gap between the wafer 11 and mask 12 is required to have a certain precision. For example, in the case of X-ray exposure of 0.1 $\mu$m line width, this gap is about 10 to 20 $\mu$m and a precision of +/−1 $\mu$m is required. The gap between the wafer and mask is detected based on the image signals of images of a low magnification factor focussed on the light reception plane 129A.

The controller 130 is provided with two image signal processing units, one for processing image signals detected with the optical system for fine alignment and the other for processing image signals detected with the optical system for coarse alignment. If the gap between the wafer and mask is adjusted by using image signals detected with the fine alignment optical system, a high speed performance of fine alignment is sacrificed because of the processing capacity of the controller 130. This high speed performance of fine alignment can be prevented from being lowered, by adjusting the gap between the wafer and mask in accordance with image signals detected with the coarse alignment optical system.

Next, the fourth embodiment of the invention will be described.

Figure 12A:
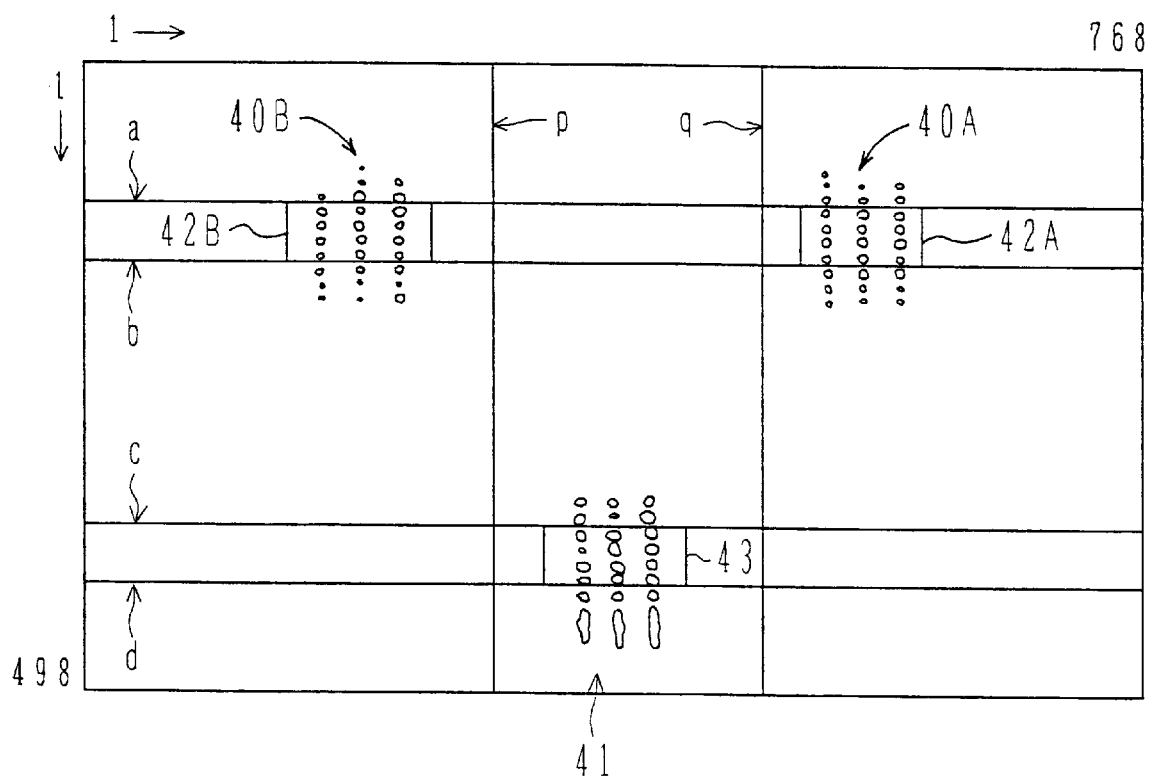
FIG. 12A is a schematic plan view showing a light reception plane with images of wafer and mask marks formed by light scattered from the marks.

FIG. 12A is a sketch of images on the light reception plane 129A or 129B formed by light scattered from the edges of the wafer and mask marks shown in FIG. 7A and observed with the position detection apparatus shown in FIG. 11. This sketch is similar to that shown in FIG. 8. The elevational direction (column direction) in FIG. 12A corresponds to the direction of a cross line between the object plane 27 shown in FIG. 7C and the X-Z plane, and the lateral direction (row direction) corresponds to the Y-axis direction shown in FIG. 7C, i.e., the direction of a cross line between a virtual plane perpendicular to the optical axis 125 and the exposure surface. Photoelectric conversion elements are disposed in a matrix form on the light reception planes 129A and 129B, and each photoelectric element at each pixel generates an image signal corresponding to a received light amount.

The uppermost pixel row in FIG. 12A is called a first row, and the n-th upper pixel row is called an n-th row. The leftmost pixel column in FIG. 12A is called a first column and the n-th left pixel row is called an n-th column. The image detectors 129A and 129B of the embodiment each have pixels of 498 rows and 768 columns.

A method of detecting a relative position of the wafer marks 13A and 13B and mask mark 14 in accordance with the images 40A, 40B and 41 formed on the light reception planes, will be described.

The mask and wafer are held by the mask holder 116 and wafer holder 115 shown in FIG. 11, and the height of the wafer is adjusted to have a predetermined gap to the mask. In this case, the relative position of the mask and wafer can be adjusted coarsely, and the relative position in the rotation direction about the Z-axis can be adjusted coarsely.

In the following description, it is assumed that FIG. 12A shows the images of a low magnification factor focussed on the light reception plane 129A of the image detector 121A. The controller 130 reads a reference pattern from the reference pattern memory 131.

Figure 12B:
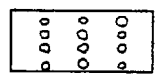
FIG. 12B is a diagram showing a reference pattern used by the fourth embodiment.

An example of the reference pattern is shown in FIG. 12B. The reference pattern is formed based upon the images formed by light scattered from edges in the depth d of focus centered to the object plane 27 shown in FIG. 7C.

An image similar to the reference pattern is derived from the images on the light reception plate 129A. The derived images include: partial images 42A and 42B containing some portions of the images 40A and 40B of the wafer marks 13A and 13B; and a partial image 43 containing some portion of the image 41 of the mask mark 14. Next, of the partial two-dimensional images 42A and 42B of the wafer mark and the partial two-dimensional image 43 of the mask mark respectively focussed on the light reception plane, the coordinates values are calculated. In accordance with the coordinate values, the relative position of the wafer marks 13A and 13B and mask mark 14 can be detected.

In accordance with this detection results, the drive mechanism 117 shown in FIG. 11 is driven to move the wafer so that the mask mark 14 is positioned at the center between the wafer marks 13A and 13B in the Y-axis direction. Coarse alignment in the Y-axis direction at a precision of about +/−0.5 μm can be performed in the above manner.

Next, fine alignment at a higher precision is performed by using the images of a high magnification factor detected with the image detector 121B.

In the following description, it is assumed that FIG. 12A shows the images of a high magnification factor focussed on the light reception plane 129B of the image detector 121B. The controller 130 reads a reference pattern for the high magnification factor, from the reference pattern memory 131.

An example of the reference pattern for the high magnification factor is shown in FIG. 12B. Similar to the coarse alignment, this reference pattern is formed based upon the images formed by light scattered from edges present in the depth d of focus of the high magnification factor image detector 121B as centered to the object plane 27 shown in FIG. 7C.

An image similar to the reference pattern is derived from the images on the light reception plate 129B. Partial two-dimensional images 42A and 42B of the wafer mark similar to the reference pattern are derived from the images 40A and 40B of the wafer marks 13A and 13B, whereas a partial two-dimensional image 43 of the mask mark similar to the reference pattern is derived from the image 41 of the mask mark 14. If images have small out-of-focus degrees and images similar to the reference image can be derived, such images formed by light scattered from edges outside of the depth d of focus may be used to form the reference pattern, in addition to the images formed by light scattered from edges in the depth d of focus.

Consider now the case wherein the partial two-dimensional images 42A and 42B of the wafer mark are positioned in the range from the a-th row to b-th row and the partial two-dimensional image 43 of the mask mark is positioned in the range from the c-th row to d-th row. It is assumed that a q-th column traverses between the partial two-dimensional image 42A of the wafer mark and the partial two-dimensional image 43 of the mask mark, and that a p-th column traverses between the partial two-dimensional image 42B of the wafer mark and the partial two-dimensional image 43 of the mask mark.

Image signals of pixels in the range from the first column to the p-th column and in the range from the (q+1)-th column to the last column are synchronously accumulated from the a-th row to the b-th row. Synchronous accumulation means that image signals of pixels in the same column from one row to another row are accumulated. Next, image signals of pixels in the range from the (p+1)-th column to the q-th column are synchronously accumulated from the c-th row to the d-th row. The image signals obtained by two synchronous accumulations are synthesized to obtain a single one-dimensional synthesized image signal.

Figure 13:
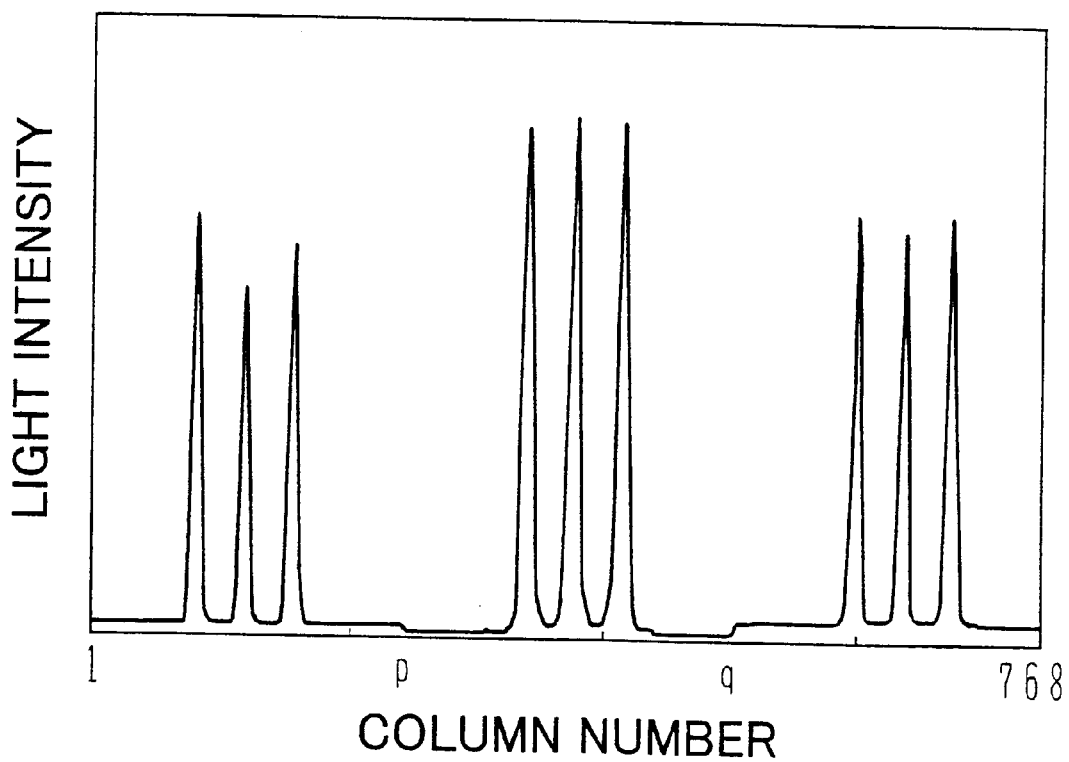
FIG. 13 is a graph showing one-dimensional synthesized image signals obtained by the fourth embodiment.

FIG. 13 shows an example of the one-dimensional synthesized image signal. The abscissa of FIG. 13 represents a pixel column number, and the ordinate represents a light intensity in a relative scale. Three sharp peaks corresponding to the partial two-dimensional image 43 of the mask mark appear at the central area of the graph shown in FIG. 13, and three sharp peaks corresponding to each of the partial two-dimensional images 42A and 42B of the wafer mark appear on both sides of the three sharp peaks in the central area. Steps are formed at positions corresponding to the p-th column and q-th column. This is because the image signals of pixels in the range from the a-th row to the b-th row are synchronously accumulated in the range from the first column to the p-th column and in the range from the (q+1)-th column to the last column, whereas the image signals of pixels in the range from the c-th row to the d-th row are synchronously accumulated in the range from the (p+1)-th column to the q-th column.

An S/N ratio can be improved by performing synchronous accumulation of image signals of a plurality of rows. Next, to what degree the S/N ratio can be improved will be described.

Figure 14:
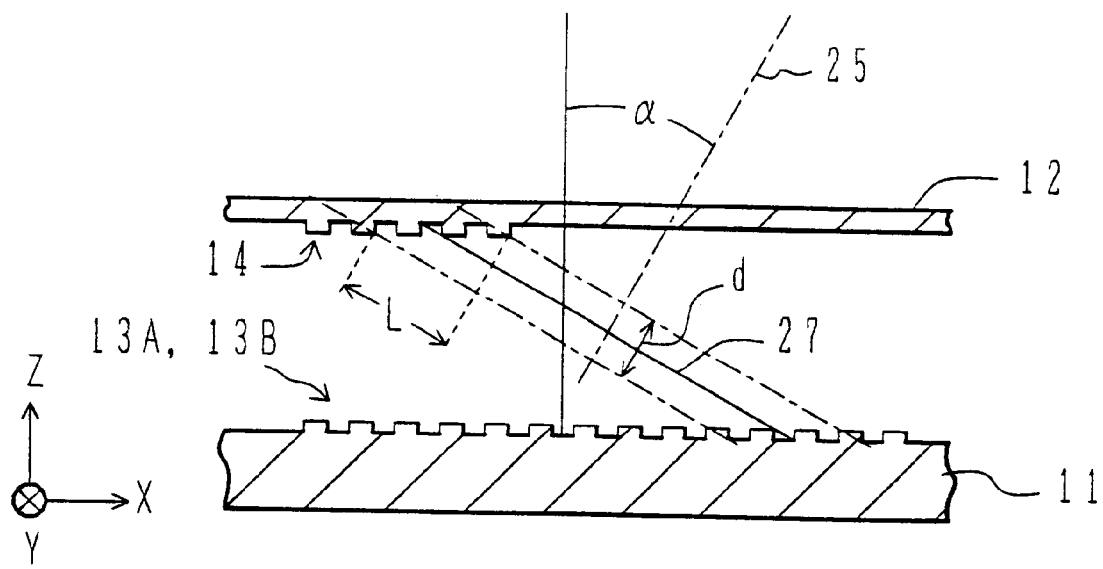
FIG. 14 is a cross sectional view taken along one-dot chain line C2—C2 shown in FIG. 7A.

FIG. 14 is a cross sectional view of the wafer and mask in the region near the object plane, and is similar to FIG. 7C.

As shown in FIG. 14, an angle of the optical axis 125 of the optical system 120 relative to the direction normal to the exposure surface is represented by α. Images of edges of the mask mark 14 can be focussed clearly upon the light reception plane 129B if the edges are positioned in the range of the depth d of focus. The width L of an image of this focussing range vertically projected upon the object plane 27 is given by:

$$L=d/\tan(\alpha) \quad (10)$$

If the high magnification factor of an image focussed on the light reception plane 129B shown in FIG. 12A is represented by N and the pixel pitch in the column direction on the light reception plane 129B is represented by P, then the number (d−c+1) of rows traversing a clear image portion 43 is given by:

$$d-c+1=L/(P/N) \quad (11)$$

The equations (9) and (10) are substituted in the equation (11) so that the following equation is obtained:

$$d-c+1=N\times\lambda/(NA^2\times P\times\tan(\alpha)) \quad (12)$$

In the position alignment of this embodiment, N=100, λ=0.6 μm, NA=0.35, P=13 μm and α=30°. These values are substituted into the equation (12), leading to the number (d−c+1) of rows of nearly 65. Synchronous accumulation of image signals of 65 rows improves the S/N ratio by about $65^{1/2}$ which is nearly an eightfold.

By using the waveforms shown in FIG. 13, the relative position of the mask and wafer marks can be detected by the method similar to that described with FIGS. 9A and 9B. The distance between centers can be obtained by interpolation calculation at a precision of (P/N) μm or shorter. With this high precision position alignment, a precision of +/−2 to 3 nm is possible.

In the fourth embodiment, while the synchronous accumulation for the pixels in the range from the a-th row to the b-th row of the light reception plane 129B shown in FIG. 12A is performed, the pixels in the range from the (p+1)-th column to the q-th column are not synchronously accumulated. Further, while the synchronous accumulation for the pixels in the range from the c-th row to the d-th row is performed, the pixels in the range from the first column to the p-th column and in the range from the (q+1)-th column to the last column are not synchronously accumulated. It is therefore possible to shorten the time required for the synchronous accumulation.

In the fourth embodiment, although the area subjected to the synchronous accumulation has been determined as above, other partial areas may be subjected to the synchronous accumulation. In such a case, the partial areas subjected to the synchronous accumulation are decided so that the partial two-dimensional images 42A and 42B of the wafer mark and the partial two-dimensional image 43 of the mask mark overlap at least at portions of accumulation areas. By deciding the accumulation area in the above manner, the calculation time can be shortened and position alignment can be performed at a high precision because the S/N ratio can be improved.

Also in the fourth embodiment, two images of the two wafer marks and one image of one mask mark are focussed upon the light reception plane. Instead, two images may be formed on the light reception plane to detect the relative position of the two images. In this case, the relative position of the two images can be detected from the image signals obtained through synchronous accumulation of image signals in the column direction in the two areas each of which overlaps at least a portion of each of the two images.

In the above-described embodiments, position alignment of a wafer and a mask has been described. The above embodiments are not limited only to the position alignment of a wafer and a mask, but are applicable also to the position alignment of a first member having a main surface and a second member disposed apart from the main surfaces by a certain gap.

The present invention has been described in connection with the preferred embodiments. The invention is not limited only to the above embodiments. It is apparent that various modifications, improvements, combinations, and the like can be made by those skilled in the art.

What is claimed is:

1. A position detecting method comprising the steps of:
    disposing a member with an exposure surface to be exposed and an exposure mask in proximity with each other, with a gap being set between the exposure surface and the exposure mask, the member having an alignment mark formed on the exposure surface, the alignment mark having edges or apexes for scattering incident light, the exposure mask having a mask mark formed on a surface thereof, the mask mark having edges or apexes for scattering incident light; and
    detecting a relative position of the member and the exposure mask by applying illumination light to the edges or apexes of the alignment and mask marks, by focussing light scattered from the alignment and mask marks on a light reception plane, and by observing images on the light reception plane, whereby a light flux scattered from one of the alignment and mask marks is attenuated or light fluxes scattered from both of the alignment and mask marks are attenuated differently, so that a light intensity of an image formed by the light flux scattered from the alignment mark and focussed on the light reception plane becomes near to a light intensity of an image formed by the light flux scattered from the mask mark and focussed on the light reception plane.

2. A position detection method according to claim 1, wherein in said relative position detecting step, light scattered from the alignment mark is focussed via a first optical filter, and light scattered from the mask mark is focussed via a second optical filter having a transmission factor different from a transmission factor of the first optical filter.

3. A position detection method according to claim 2, wherein the first and second optical filters are defined in different areas of one optical filter member.

4. A position detection method according to claim 3, wherein the optical filter member is disposed just in front of the light reception plane.

5. A position detection method according to claim 1, wherein in said relative position detecting step, scattered light is focussed on the light reception plane by using an optical system having a same optical axis as an optical axis of the illumination light.

6. A position detection apparatus comprising:
    an illumination optical system for applying illumination light to a member having an exposure surface to be exposed and to a mask disposed in parallel to the exposure surface of the member and spaced by a gap from the exposure surface; and
    an observation optical system which has an optical axis oblique to the exposure surface of the member and which focusses light scattered from the member and the mask onto a light reception plane,
    wherein said observation optical system comprises an optical filter disposed just in front of the light reception plane, and a transmission factor of the optical filter is different between an area corresponding to an area where light scattered from the member is focussed and an area corresponding to an area where light scattered from the mask is focussed.

7. A position detecting apparatus according to claim 6, wherein the optical filter comprises a neutral density filter defining two areas having different transmission factors.

* * * * *

UNITED STATES PATENT AND TRADEMARK OFFICE
CERTIFICATE OF CORRECTION

PATENT NO.    : 6,285,439 B1
DATED         : September 4, 2001
INVENTOR(S)   : Tsutomu Miyatake It is certified that error appears in the above-identified patent and that said Letters Patent is hereby corrected as shown below:

Title page,
Item [56], References Cited, U.S. PATENT DOCUMENTS, insert
-- 5,218,193   6/1993   Miyatake   356/40 --.

Signed and Sealed this

Twenty-fourth Day of June, 2003

JAMES E. ROGAN
*Director of the United States Patent and Trademark Office*